US007810398B2

(12) United States Patent
Zimmer

(10) Patent No.: US 7,810,398 B2
(45) Date of Patent: Oct. 12, 2010

(54) CONCEPT FOR DETECTING A CHANGE OF A PHYSICAL QUANTITY BY MEANS OF A CONDUCTOR STRUCTURE

(75) Inventor: Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 420 days.

(21) Appl. No.: 11/855,293

(22) Filed: Sep. 14, 2007

(65) Prior Publication Data

US 2008/0084205 A1    Apr. 10, 2008

(30) Foreign Application Priority Data

Sep. 15, 2006    (DE) .................. 10 2006 043 410

(51) Int. Cl.
*G01F 1/56* (2006.01)
(52) U.S. Cl. ................................ 73/861.08
(58) Field of Classification Search ........... 73/861.08, 73/152.46; 324/252, 251, 107, 427, 253, 324/207.21; 374/185
See application file for complete search history.

(56) References Cited

U.S. PATENT DOCUMENTS

| 4,994,742 | A | * | 2/1991 | Lowther | ............. 324/251 |
| 5,061,890 | A | * | 10/1991 | Longini | ............. 324/107 |
| 5,250,903 | A | * | 10/1993 | Limuti et al. | ............. 324/427 |
| 6,380,735 | B1 | * | 4/2002 | Kawakami | ............. 324/253 |
| 6,642,714 | B2 | * | 11/2003 | Kobayashi et al. | ............. 324/252 |
| 6,898,984 | B2 | | 5/2005 | Schöb | |
| 7,323,870 | B2 | * | 1/2008 | Tatschl et al. | ............. 324/252 |
| 7,434,457 | B2 | * | 10/2008 | Goodwin et al. | ........ 73/152.46 |

FOREIGN PATENT DOCUMENTS

| DE | 100 53 456 A1 | 8/2001 |
| DE | 10 2004 047 770 A1 | 4/2006 |
| EP | 1 391 698 A2 | 2/2004 |
| WO | WO 2005/054887 A1 | 6/2005 |

OTHER PUBLICATIONS

Freitas, P. P., et al., "Spin valve sensors," Sensors and Actuators, 2000, pp. 2-8, vol. 81, Elsevier Science S.A.
Vieth, M., et al., "Contactless current detection with GMR sensors based on an artificial antiferromagnet (AAF) subsystem," Sensors and Actuators, 2000, pp. 44-48, vol. 81, Elsevier Science S.A.

* cited by examiner

*Primary Examiner*—Jewel Thompson
(74) *Attorney, Agent, or Firm*—Slater & Matsil, L.L.P.

(57) ABSTRACT

An apparatus for detecting a change of a physical quantity by means of a conductor structure having a processor for applying a defined supply signal to the conductor structure so as to effect a current flow through the conductor structure, the current flow being changeable by the physical quantity, and a detector for detecting a magnetic field caused by the current flow through the conductor structure by means of a magnetoresistive element allocated to the conductor structure, a change of the physical quantity being associated with a change of the detected magnetic field.

52 Claims, 13 Drawing Sheets

$B_x$ at I=10mA (=5.00mA/μm²)

US 7,810,398 B2

CONCEPT FOR DETECTING A CHANGE OF A PHYSICAL QUANTITY BY MEANS OF A CONDUCTOR STRUCTURE

This application claims priority from German Patent Application No. 10 2006 043 410.2, which was filed on Sep. 15, 2006, and is incorporated herein in its entirety by reference.

TECHNICAL FIELD

An embodiment of the present invention relates to an apparatus and a method for determining changes of a temperature-dependent resistance value of a conductor structure so as to determine a physical characteristic of a medium coupled thermally to the conductor structure, the characteristic being utilized, for example, in automotive technology and in particular in air-mass sensors.

BACKGROUND

In automotive electronics, for certain applications, simple and high-precision measurement of a change of conductor resistances is necessitated. This is accomplished by so-called air-mass sensors, for example. The measured quantity of an air-mass sensor, which is often indicated in kg/h of air or gas, may, for example, be used for controlling an injected amount of fuel. The sensors employed in motor vehicles operate according to a thermal principle. The power output of a heated sensor element serves a measured quantity for an air or gas mass current.

Air-mass sensors may particularly be used for the determination of intake air masses of internal combustion engines. For combustion to be complete and, as far as the exhaust gas composition is concerned, optimum, they are indispensable. In conventional air-mass sensors, for example, so-called hot-element anemometers (=thermal air-mass sensor) are employed. The measuring principle in hot-element anemometers consists in detecting the heating-up of a heater element and the cooling-down thereof with respect to the power output (amount of heat released) from the heater element to the air mass flowing past the heater element. Here, for example, are two sensors, one of which detects the temperature of the intaken air and the other one being heated up to a certain excess temperature compared to the ambient temperature, are located in different branches of a Wheatstone bridge circuit. The heated-up sensor serving as a measuring probe is cooled down by the air flow in dependence on the speed and temperature as well as the heat capacity thereof. The additional amount of energy necessitated for maintaining the adjusted excess temperature of the sensor or measuring probe is then a measure for the air mass put through.

In further known variations of air-mass sensors, the temperature change caused by an air flow is measured by at least one pair consisting of a heating and a temperature measuring resistor.

In all cases, the quantity to be measured may be retraced to a change of resistance, the signal of which depends on a temperature coefficient TCR of the material used for the hot-element anemometer. The sensitivity of the measurement is therefore limited to the temperature coefficient TCR.

SUMMARY OF THE INVENTION

According to an embodiment, an apparatus for detecting a change of a physical quantity by means of a conductor structure may have: a processor for applying a defined supply signal to the conductor structure so as to effect a current flow through the conductor structure, the current flow being changeable by the physical quantity; and a detector for detecting a magnetic field caused by the current flow through the conductor structure, by means of a magnetoresistive element allocated to the conductor structure, a change of the physical quantity being associated with a change of the detected magnetic field.

According to another embodiment, an apparatus for detecting a temperature-dependent resistance change of a conductor structure adapted to be thermally coupled to a liquid or gaseous medium flowing past may have: a processor for applying a defined supply voltage to the conductor structure so as to effect, in dependence on a temperature-dependent resistance of the conductor structure, a current flow through the conductor structure; and a detector for detecting a magnetic field caused by the current flow through the conductor structure by means of a magnetoresistive element allocated to the conductor structure, a change of the temperature-dependent resistance of the conductor structure being associated with a change of the detected magnetic field.

According to another embodiment, a sensor for detecting the mass of a flowing, liquid or gaseous medium may have: a conductor structure, having a temperature-dependent resistance value and adapted to be thermally coupled to the gaseous medium such that the temperature-dependent resistance value is a measure for a physical characteristic of the flowing, liquid or gaseous medium; a voltage supply for applying a defined supply voltage to the conductor structure so as to effect, in dependence on the temperature-dependent resistance value of the conductor structure, a current flow therethrough; and a magnetoresistive element allocated to the conductor structure so as to detect the magnetic field caused by the current-carrying conductor structure, a change of the temperature-dependent resistance value of the conductor structure being associated with a change of the detected magnetic field.

According to another embodiment, a method for detecting a change of a physical quantity by means of a conductor structure may have the steps of: applying a defined supply signal to the conductor structure so as to effect a current flow through the conductor structure, the current flow being changeable by the physical quantity; and detecting a magnetic field caused by the current flow through the conductor structure by means of a magnetoresistive element allocated to the conductor structure, a change of the physical quantity being associated with a change of the detected magnetic field.

According to another embodiment, a method for detecting a temperature-dependent resistance change of a conductor structure adapted to be thermally coupled to a liquid or gaseous medium flowing past may have the steps of: applying a defined supply voltage to the conductor structure so as to effect, in dependence on a temperature-dependent resistance of the conductor structure, a current flow through the conductor structure; and detecting a magnetic field caused by the current flow through the conductor structure by means of a magnetoresistive element allocated to the conductor structure, a change of the temperature-dependent resistance of the conductor structure being associated with a change of the detected magnetic field.

An embodiment may have a computer program for performing, when the computer program runs on a computer and/or microcontroller, the above method for detecting a change of a physical quantity by means of a conductor structure or the above method for detecting a temperature-dependent resistance change of a conductor structure adapted to be thermally coupled to a liquid or gaseous medium flowing past.

According to embodiments, the present invention provides an apparatus for detecting a change of a physical quantity by means of a conductor structure having means for applying a defined supply signal to the conductor structure so as to cause a current flow through the conductor structure, the current flow being changeable by the physical quantity, and means for detecting a magnetic field caused by the current flow through the conductor structure by means of a magnetoresistive element allocated to the conductor structure, a change of the physical quantity being associated with a change of the magnetic field detected.

According to further embodiments, the present invention provides an apparatus for detecting a temperature-dependent resistance value of a conductor structure adapted to be thermally coupled to a liquid or gaseous medium flowing past, having means for applying a defined supply voltage to the conductor structure so as to cause a current flow through the conductor structure in dependence on the temperature-dependent resistance value of the conductor structure, and means for detecting a magnetic field caused by the current flow through the conductor structure by means of a magnetoresistive element allocated to the conductor structure, a change of the temperature-dependent resistance value of the conductor structure being associated with a change of the magnetic field detected.

According to a further embodiment of the present invention, a sensor for detecting the mass of a flowing liquid or gaseous medium comprises a conductor structure having a temperature-dependent resistance value and being adapted to be thermally coupled to the gaseous medium such that the temperature-dependent resistance value is a measure for a physical characteristic of the flowing liquid or gaseous medium, a voltage supply for applying a defined supply voltage to the conductor structure so as to effect, in dependence on the temperature-dependent resistance value of the conductor structure, a current flow therethrough, and a magnetoresistive element, allocated to the conductor structure so as to detect the magnetic field caused by the current-carrying conductor structure, a change of the temperature-dependent resistance value of the conductor structure being associated with a change of the magnetic field detected.

According to embodiments, the present invention provides a method for detecting a change of a physical quantity by means of a conductor structure having a step of applying a defined supply signal to the conductor structure so as to effect a current flow through the conductor structure, the current flow being changeable by the physical quantity, and a step of detecting a magnetic field caused by the current flow through the conductor structure by means of a magnetoresistive element allocated to the conductor structure, a change of the physical quantity being associated with a change of the magnetic field detected.

According to further embodiments, the present invention provides a method for detecting a change of resistance of a conductor structure, having a step of applying a defined supply voltage to the conductor structure so as to effect, in dependence on the temperature-dependent resistance value of the conductor structure, a current flow through the conductor structure, and a step of detecting a magnetic field caused by the current flow through the conductor structure by means of a magnetoresistive element allocated to the conductor structure, a change of the resistance value of the conductor structure being associated with a change of the magnetic field detected.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
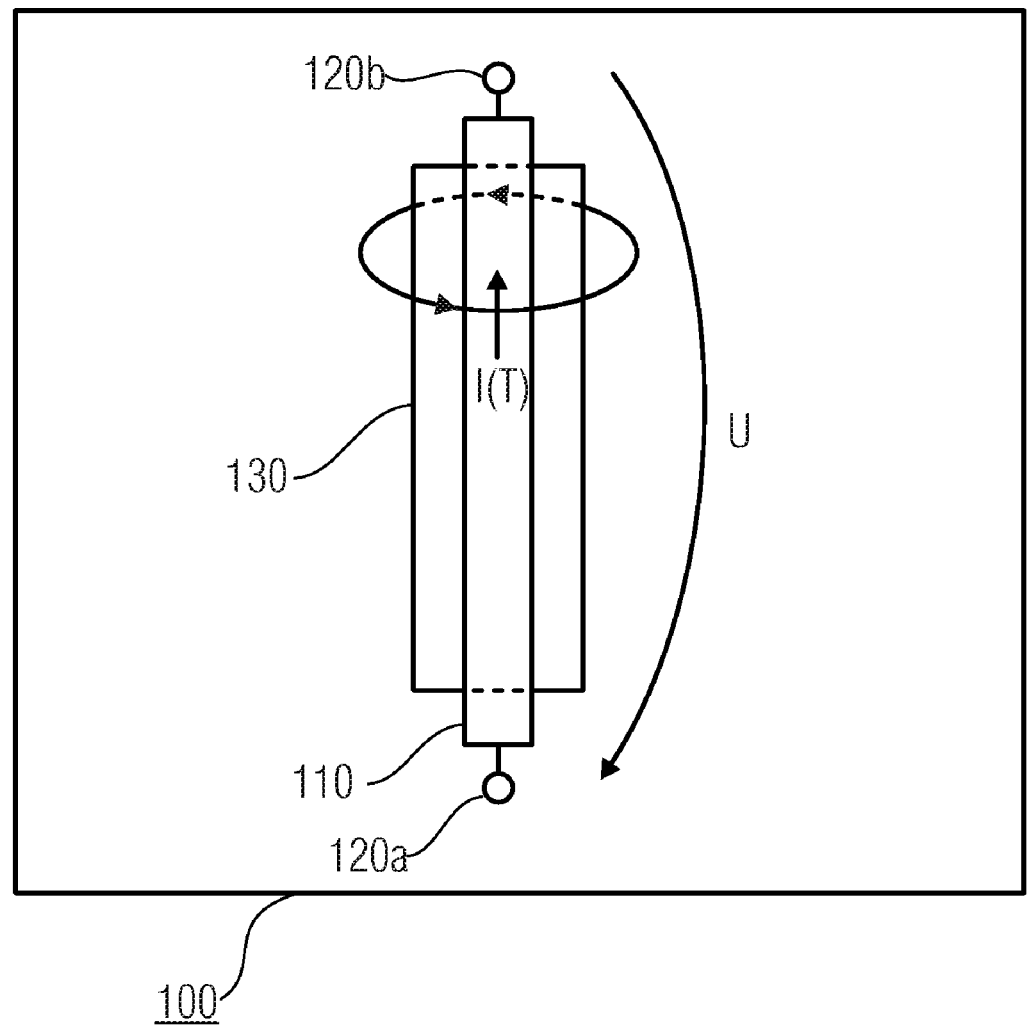
FIG. 1 is a schematic representation of an apparatus for determining a temperature-dependent resistance value of a conductor structure according to an embodiment of the present invention.

With respect to the following description, it is to be noted that in the different embodiments, functional elements that are identical or have the same effect are designated with like reference numerals, and therefore the descriptions of these functional elements in the various embodiments illustrated in the following are interchangeable.

In the following, the term "signal" is used for currents or voltages alike unless explicitly stated otherwise.

FIG. 1 shows a top view of an apparatus 100 for detecting a change of a physical quantity or characteristic according to an embodiment of the present invention. The apparatus 100 comprises a conductor structure 110, two terminals 120a, 120b for applying a defined supply signal to the conductor structure 110, and means 130 for detecting a magnetic field that may be caused by a current flow through the conductor structure 110.

A change of the magnetic field detected by the means 130 is associated with a change of the physical quantity or characteristic, as the current flow through the conductor structure 110 causing the magnetic field is changeable by means of a change of the physical quantity. The physical quantity may generally be an electric impedance having capacitive, inductive and/or resistive elements or features. Furthermore, the physical quantity causing a current flow through the conductor structure 110 may, for example, be a supply voltage for the conductor structure 110.

A change of the physical quantity may be, according to embodiments of the present invention, a temperature-dependent change of resistance of the conductor structure 110. The defined supply signal may be an arbitrary reconstructable voltage, wherein the arbitrary reconstructable voltage may have a periodic AC voltage, a constant voltage or a time-pulsed DC voltage. The magnetoresistive element comprises, according to embodiments of the present invention, a GMR (giant magneto resistance) structure, a TMR (tunnel magneto resistance) structure or a magnetoresistance structure. According to embodiments of the present invention, the apparatus 100 further comprises means for providing an external magnetic support field acting on the magnetic field caused by means of the current flow through the conductor structure 110 so that a resistive threshold of the magnetoresistive element 130 is adjustable with respect to a change of a physical quantity between two different values of the physical quantity via the external magnetic support field. The external magnetic support field may be adjustable such that it compensates the magnetic field caused by the current flow through the conductor structure within a tolerance range at a defined temperature of the conductor structure at the location of the magnetoresistive element allocated to the conductor structure.

Although the current flow through the conductor structure 110 may, for example, be based on a capacitive or an inductive change, in the following, the present invention will be described by means of a temperature-dependent change of resistance of the conductor structure 110, wherein all embodiments of FIGS. 2 to 16 are also applicable to the general embodiment of FIG. 1 and vice versa.

It should become clear however, that the embodiments discussed in the following and describing a temperature-dependent change of resistance, are likewise applicable to arbitrary effects causing a change of current through the conductor structure 110.

According to embodiments of the present invention, the defined supply signal is advantageously a constant or pulsed supply voltage. In principle, however, the supply voltage may have any arbitrary reconstructable time behavior such as harmonic or periodic behavior.

According to embodiments of the present invention, the means 130 for detecting a magnetic field comprises a sensor element on the basis of magnetoresistive elements or structures, which are in the following generally referred to as xMR structures. In the following description, the term "xMR structure" is to include all known magnetoresistive structures such as AMR (anisotropic magneto resistance) structures, GMR (giant magneto resistance) structures, CMR (colossal magneto resistance) structures, TMR (tunnel magneto resistance) structures or EMR (extraordinary magneto resistance) structures. In technical applications of GMR and TMR sensor assemblies, nowadays, advantageously, so-called spin-valve structures are often used, as is exemplarily represented in FIGS. 2a-c and FIG. 3.

In the following, GMR structures are first briefly and generally addressed. GMR structures are operated in a so-called CIP configuration (CIP=current-in-plane), that is, the current applied flows in parallel to the ply structure. There are several fundamental types of GMR structures that have become accepted in practice. In practice, for example, when used in the automotive technology, above all large temperature windows such as in the range of −40° C. to +150° C., and small field intensities of few kA/m are necessitated for optimum and safe operation. The GMR structures most important in practical use are represented in FIGS. 2a-c.

Figure 2A:
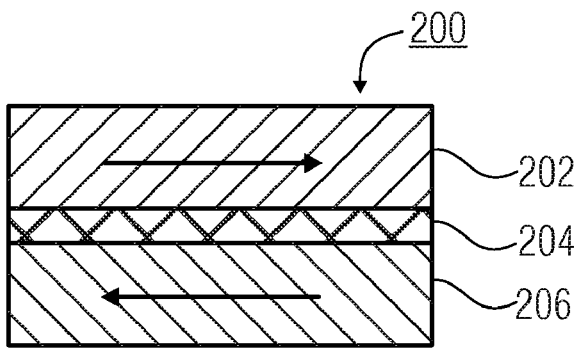
FIGS. 2a-2c are schematic representations of the fundamental structure of various types of GMR sensor elements and the accompanying schematic representation of the magnetic-field dependence of the magnetization and of the resistance value of the magnetoresistive structure.

The GMR structure represented in FIG. 2a shows the case of a coupled GMR system 200, wherein two magnetic layers 202, 206 made, for example, of cobalt (Co), are separated by a non-magnetic layer 204 made, for example, of copper (Cu). The thickness of the non-magnetic layer 204 is chosen such that an antiferromagnetic coupling of the soft-magnetic layers 202, 206 arises without any magnetic field being present. The arrows illustrated serve to emphasize this. An external field then enforces the magnetizations of the soft-magnetic layers 202, 206 to be oriented in parallel, whereby the resistance value of the GMR structure decreases.

Figure 2B:
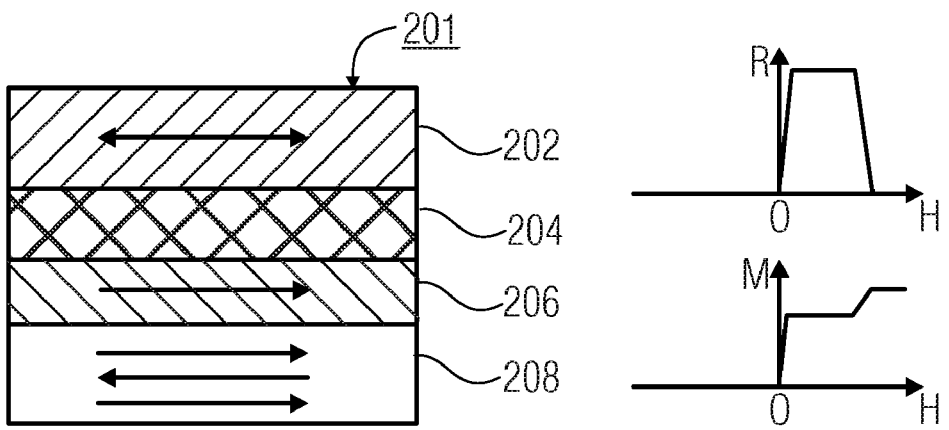
Figure 2C:
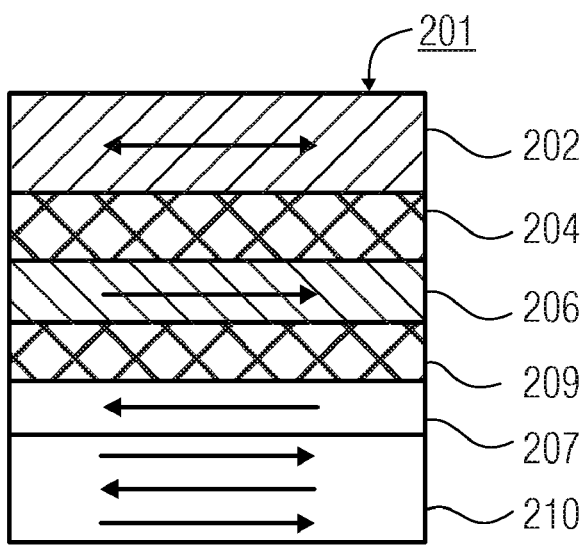

The GMR structure represented in FIG. 2b shows a spin-valve system 201, wherein the thickness of the non-magnetic layer 204 is chosen such that a magnetic coupling of the soft-magnetic layers 202, 206 can no longer arise. The lower magnetic layer 206 is strongly coupled to an antiferromagnetic layer 208, so that it is magnetically hard (comparable to a permanent magnet). The upper magnetic layer 202 is soft-magnetic and serves as a measuring layer. It may be re-magnetized by as little as a small external magnetic field M, whereby the resistance value R changes.

In the following, the spin-valve assembly 201 illustrated in FIG. 2b is described in greater detail. Such a spin-valve structure 201 consists of a soft-magnetic layer 202 separated (magnetically decoupled) from a second soft-magnetic layer 206 by a non-magnetic layer 204, the magnetization direction of which is, however, retained by the coupling to an antiferromagnetic layer 208 by means of a so-called "exchange bias interaction". The fundamental mode of operation of a spin-valve structure may be made clear by means of the magnetization and R(B) curve in FIG. 2b. The magnetization direction of the magnetic layer 206 is retained in negative direction. If the external magnetic field M is raised from negative to positive values, the "free" soft-magnetic layer 202 reverses in the proximity of the zero passage (B=0), and the resistance value R surges. The resistance value R remains high until the external magnetic field M is large enough to overcome the exchange coupling between the soft-magnetic layer 206 and the antiferromagnetic layer 208 and directs the magnetic layer 206 also in parallel to the external field. Then the resistance decreases.

The GMR structure 201 illustrated in FIG. 2c differs from the GMR structure represented in FIG. 2b in that the lower antiferromagnetic layer 208 is replaced by a combination of a natural antiferromagnet 210 and an artificial antiferromagnet 206, 207, 209 ("synthetic antiferromagnet", SAF) located thereabove, which consists of the magnetic layer 206, a ferromagnetic layer 207 and a non-magnetic layer 209 located therebetween. In this manner, the magnetization direction of the magnetic layer 206 is retained. The upper, soft-magnetic layer 202 again serves as a measuring layer the magnetization direction of which may easily be rotated by means of an external magnetic field. The advantage of using the combination of a natural and an artificial antiferromagnet in comparison to the structure according to FIG. 2b is the greater field and temperature stability.

Figure 3:
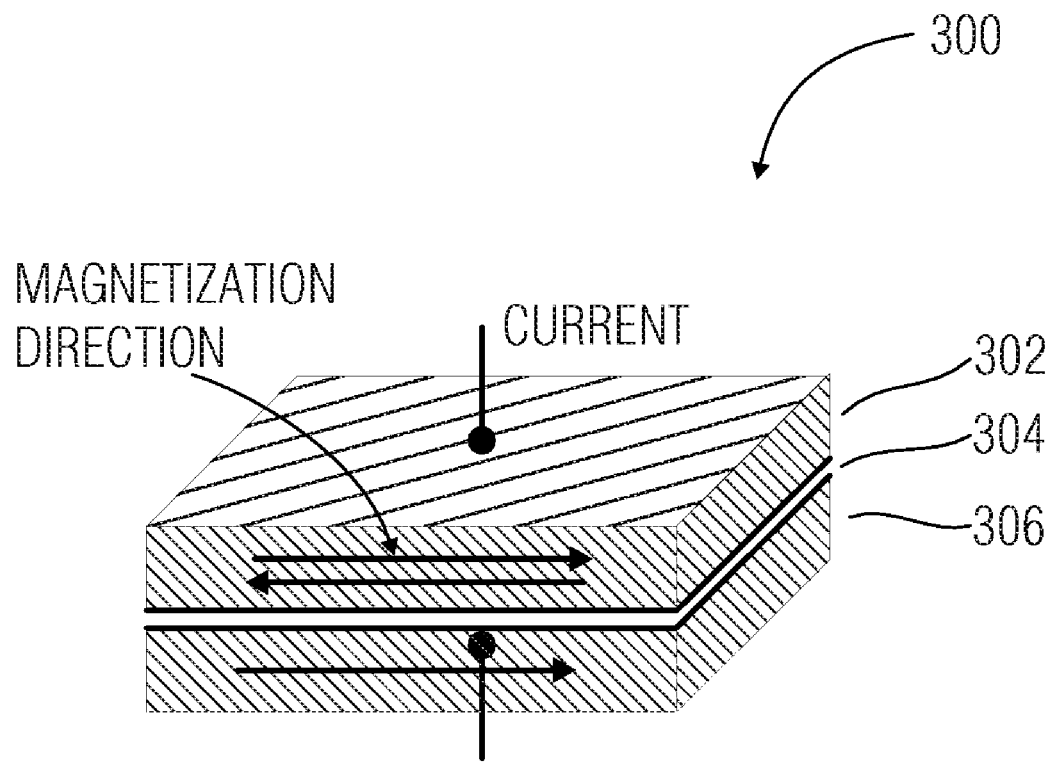
FIG. 3 is a schematic representation of a magnetoresistive TMR sensor element.

In the following and with respect to FIG. 3, the so-called TMR structures are generally addressed. For TMR structures, the application spectrum is very similar to that of GMR structures. FIG. 3 shows a typical TMR structure 300. The tunnel magneto resistance TMR is obtained in tunnel contacts, wherein two ferromagnetic electrodes 302, 306 are decoupled by means of a thin insulating tunnel barrier 304.

Electrons can tunnel through this thin barrier 304 between the two electrodes 302, 306. The tunnel magneto resistance is based on the fact that the tunnel current depends on the relative orientation of the magnetization direction in the ferromagnetic electrodes.

The various magnetoresistive structures described above and the GMR and/or TMR structures in particular therefore have an electric characteristic dependent on a magnetic field present, that is, the specific resistance of an xMR structure of a magnetoresistive device is influenced by an external magnetic field acting thereon, wherein in the following, the inventive concept for determining a temperature-dependent resistance value of a conductor structure is discussed in greater detail.

As has already been explained above, the inventive apparatus 100 schematically shown in FIG. 1 may, for example, be used in an air-mass sensor in internal combustion engines. Here, a pulsed or constant supply voltage is fed to the conductor structure or thermistor 110 so as to effect a current flow through the conductor 110. An intensity of the current flowing through the conductor 110 is determined, according to Ohm's law, by the resistance value Rheater(T) of the conductor 110, which depends on the temperature T, wherein the change of the resistance value of the conductor 110 is a measure of a physical characteristic of a liquid or gaseous medium flowing past, wherein the physical characteristic exhibits a mass, a throughput, a flow velocity, a flow velocity distribution, or a temperature of the liquid or gaseous medium flowing past when the conductor 110 is thermally coupled to the fluid. A liquid or gaseous medium flowing past the thermistor 110 such as air may cause a temperature change of the conductor 110 by means of the thermal coupling and therefore cause a resistance change ΔRheater of the conductor 110. Based on the supply voltage being defined, that is, for example, constant and pulsed, the current intensity I(T) flowing through the conductor 110 changes with the resistance. The means 130 for detecting a magnetic field, which is located below the thermistor 110 with respect to the drawing plane of FIG. 1 and which is, according to an embodiment of the present invention, a magnetoresistive element having an xMR structure, may now detect a magnetic field changing with the temperature T and generated by the thermistor current I(T), the magnetic field being lateral, that is being located in a plane parallel to the reference magnetization. Possible distances between the thermistor 110 and the magnetoresistive element 130 range from 10 nm to 10 µm. Typically, distances in a range from 100 nm to 1000 nm are chosen.

A change in the magnetic field is directly proportional to the resistance change ΔRheater of the conductor 110. However, the resistance change ΔRxMR effected in the magnetoresistive element 130 by the magnetic field change by means of using GMR or TMR elements may be greater than the resistance change ΔRheater of the thermistor 110 by means of the temperature change. Furthermore, the measuring sensitivity of the magnetoresistive element 130 may be adjusted by modifying the layer structure of an xMR element in a production process, or even later, in an application by adjusting an operating point by means of magnetic support fields, for example. This will, however, be discussed in greater detail later on.

The measuring sensitivity of the inventive apparatus 100 shown in FIG. 1 is therefore not limited by the material properties and/or the temperature coefficient TCR of the conductor 110.

In the following, the inventive measuring principle is to be discussed in greater detail with respect to FIG. 4. For this purpose, FIG. 4 shows a top view of a spin-valve structure 130 having two magnetic layers 202, 206 and one non-magnetic layer 204, as has been described above.

The spin-valve structure 130 substantially consists of two adjacent ferromagnetic layers 202, 206, which for magnetic decoupling are separated by a non-magnetic spacing layer 204. The magnetization direction of one of the two magnetic layers (layer 206 in FIG. 4) is fixed by means of a special so-called stack structure and is not changed by an external magnetic field caused by the current I(T) through the conductor 110. The magnetization direction of the reference layer 206 therefore serves as a reference magnetization. The magnetization of the other ferromagnetic layer 202 may follow a direction of an external (so-called in-plane) magnetic field in an ideal manner. Therefore, the layer 202 is generally referred to as a free layer. The magnetization directions of the two magnetic layers 202 and 206 may therefore be rotated against each other. This change in the relative magnetization directions of the layers 202, 206 involves a resistance change in a manner in parallel to the layer stack (typically, a GMR structure is operated such) or in a manner perpendicular to the layer packet (operating mode of a TMR structure according to FIG. 3).

Figure 4:
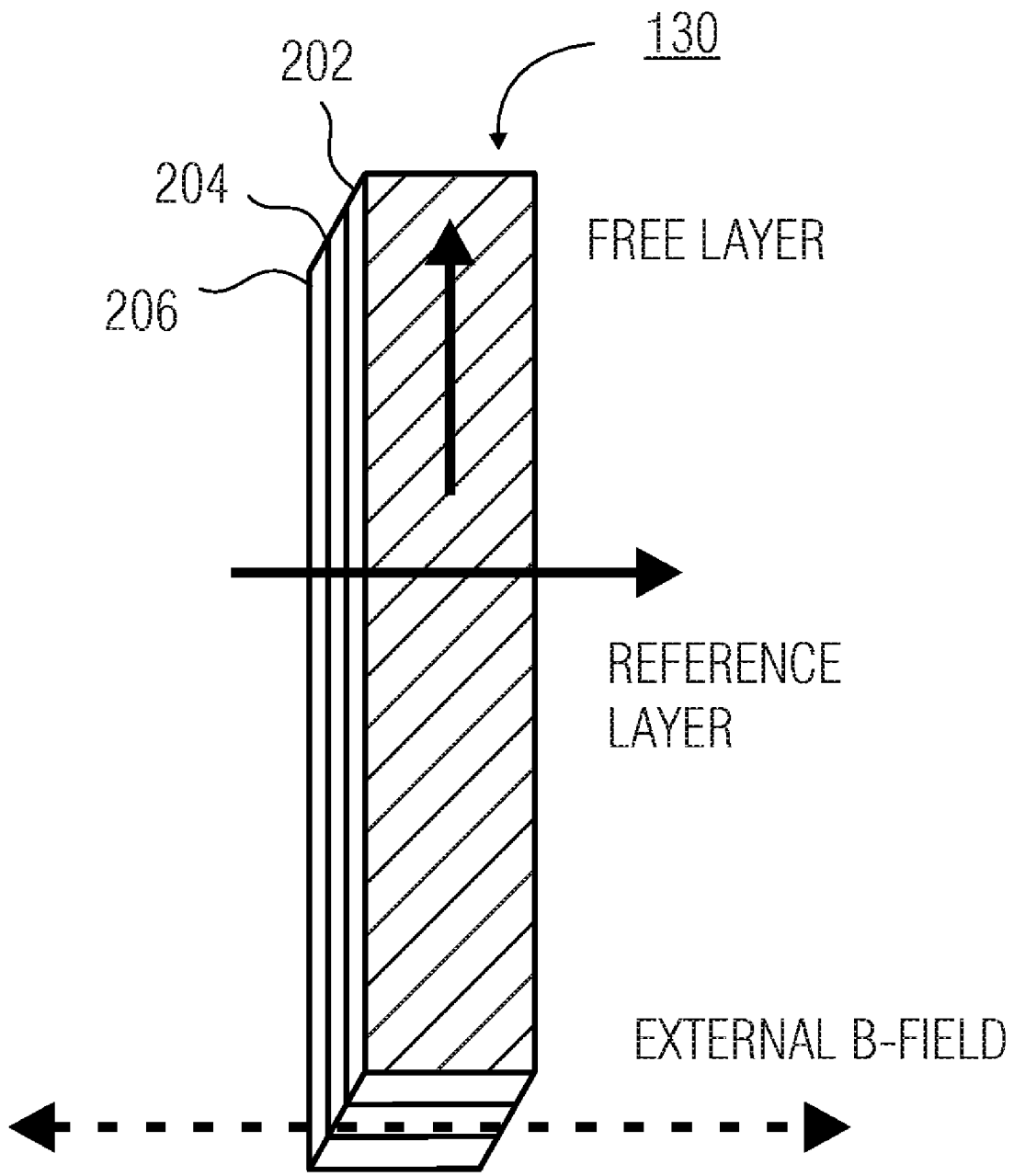
FIG. 4 is a top view of a basic configuration of an xMR spin-valve system according to an embodiment of the present invention.

For the use of the inventive concept in an air-mass sensor, the spin-valve system 130 shown in FIG. 4 is operated as follows. The reference magnetization of the reference layer 206 is directed along the axis of the external magnetic field to be detected, that is of the magnetic field created by means of the conductor 110. The longitudinal axis of the xMR structure 130 is, however, aligned in a manner perpendicular thereto, as is indicated in FIG. 4. Therefore, the external magnetic field to be detected may change the magnetization directions of the reference layer 206 and the free layer 202 between parallel (=small resistance) and antiparallel (=large resistance), and therefore change the electric resistance RxMR of the xMR structure 130 back and forth. A width ΔB and a steepness ΔRxMR/ΔB of the resistance changing range, which in the end determines the range of the magnetic field change to be detected, may, for example, be adjusted via impressed magnetic anisotropy axes in the free layer 202. Anisotropy generally stands for the direction dependence of a feature, and here in particular the direction dependence of the magnetization of the free layer 202. For this purpose, for example, the so-called shape anisotropy, which is determined by a lateral geometric aspect ratio of the xMR structure 130, is suitable. In an xMR structure, for example, wherein its length be substantially larger than its width, the magnetization advantageously remains in the direction of the longitudinal axis. This is a so-called "easy" direction. Here, the magnetic anisotropy is therefore substantially determined by the shape of the sample. Correspondingly, same is referred to as shape anisotropy. Therefore, in order to minimize the magneto-statistic energy, it is advantageous that the magnetization by the shape anisotropy is directed along the longitudinal axis of the xMR structure 130. The narrower the xMR structure, the stronger the effect. In a configuration of the xMR structure as shown in FIG. 4, the result is therefore, taking into account shape anisotropy effects, a magnetization of the free layer 202 that is perpendicular or approximately perpendicular to the reference magnetization of the reference layer 206, as is indicated in FIG. 4. In the absence of an external magnetic field, the spin-valve structure 130 therefore has a mean electric resistance RxMR. A positive or negative magnetic field along the reference magnetization axis causes the magnetization of the free layer 202 to be rotated out of its original position in a manner opposed to the shape anisotropy until it is parallel and/or antiparallel to the reference magnetization of the reference layer 206.

Figure 5:
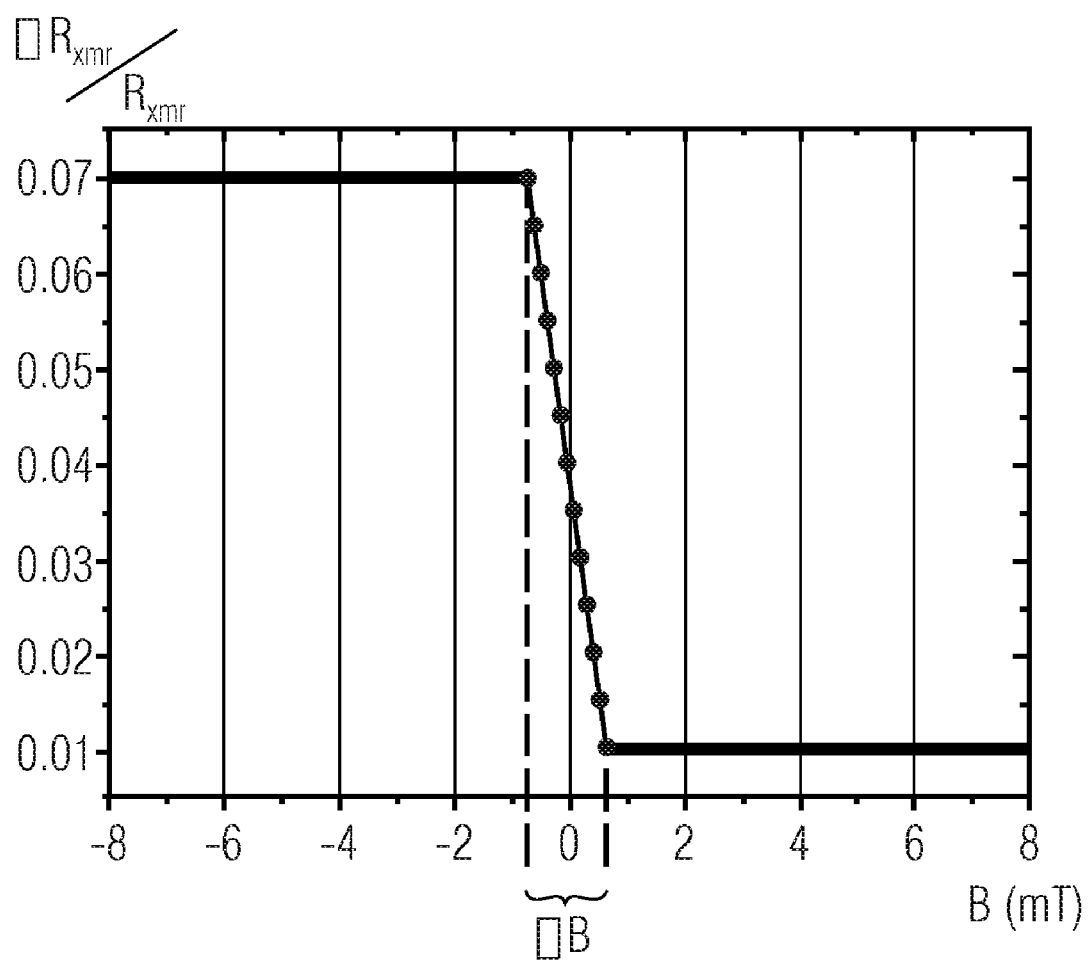
FIG. 5 is a simulated resistance characteristic (relative resistance change) of the xMR spin-valve system of FIG. 4 in dependence on the intensity of a magnetic field acting according to an embodiment of the present invention.

In order to illustrate this, FIG. 5 shows an exemplary resistance response of a spin-valve structure 130 schematically shown in FIG. 4 as a function of a magnetic field B applied from the exterior, assuming a width of the xMR strip of the spin-valve structure 130 of 4 μm so as to impress a shape anisotropy into the sensor layer 202. Typical xMR strip widths of the spin-valve structure 130 range from 0.4 μm to 40 μm, depending on the length of the spin-valve structure. This causes the changing behavior of the xMR structure 130 to be converted to a defined and linear resistance change in a manner symmetrically around a magnetic flux density B=0 and/or field intensity H=0.

The width of the linear range ΔB usable for the detection of a magnetic field change with a slope ΔRxMR/ΔB that is at least approximately linear may therefore, for example, specifically be adjusted via shape anisotropy. The characteristic shown in FIG. 5 is therefore suitable for measuring changes in a magnetic field the field intensity of which is not greater than ΔB/2, according to amount. Here, ΔB describes half the range of magnetic field intensities effecting a linear resistance change ΔRxMR of the xMR structure 130. So as to be able to detect small changes in a magnetic field intensity B in basic magnetic fields that are larger as far as the amount is concerned, advantageously, the ΔB-wide resistance changing field with a slope ΔRxMR/ΔB that is at least approximately linear may be shifted towards magnetic fields that are larger as far as the amount is concerned.

This shifting of the resistance changing field with a slope ΔRxMR/ΔB that is at least approximately linear may, for example, be achieved inherently by implementing a ferro- or antiferromagnetic coupling between the free sensor layer 202 and the reference layer 206. For this purpose, the thickness of the non-magnetic intermediate layer 204 may be adjusted such that it effects a coupling of the desired direction and intensity between the magnetic layers 202, 206 according to the RKKY effect (Ruderman-Kittel-Kasuya-Yosida effect). A further possibility for inducing, for example, a ferromagnetic intermediate layer coupling is producing a specific roughness between the magnetic layers 202, 206, for example, by means of certain conditions of growth. This adjusted roughness then results in a ferromagnetic coupling between the sensor layer 202 and the reference layer 206 via the so-called "orange peel" coupling. This in turn results in the magnetizations of both magnetic layers 202, 206, in the absence of an external magnetic field, being oriented in parallel, that is yielding a smaller electric resistance. So as to reach the resistive threshold, an external magnetic field must first overcome this ferromagnetic coupling between the layers 202, 206, which equals a shift of the curve illustrated in FIG. 5 along the B axis. The shifting may be effected towards positive B values and negative B values alike, in a value range, according to amount, of typically less than 10 mT.

Figure 6:
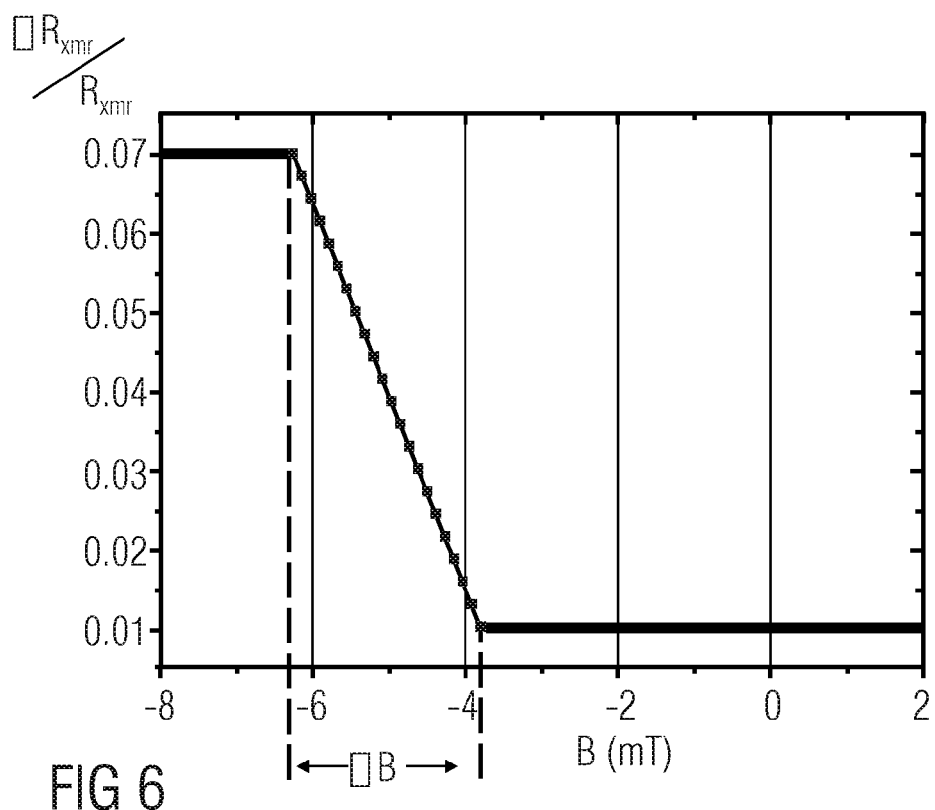
FIG. 6 is a resistance characteristic by adjusting the stack design of the spin-valve system of FIG. 4 according to an embodiment of the present invention.
Figure 7:
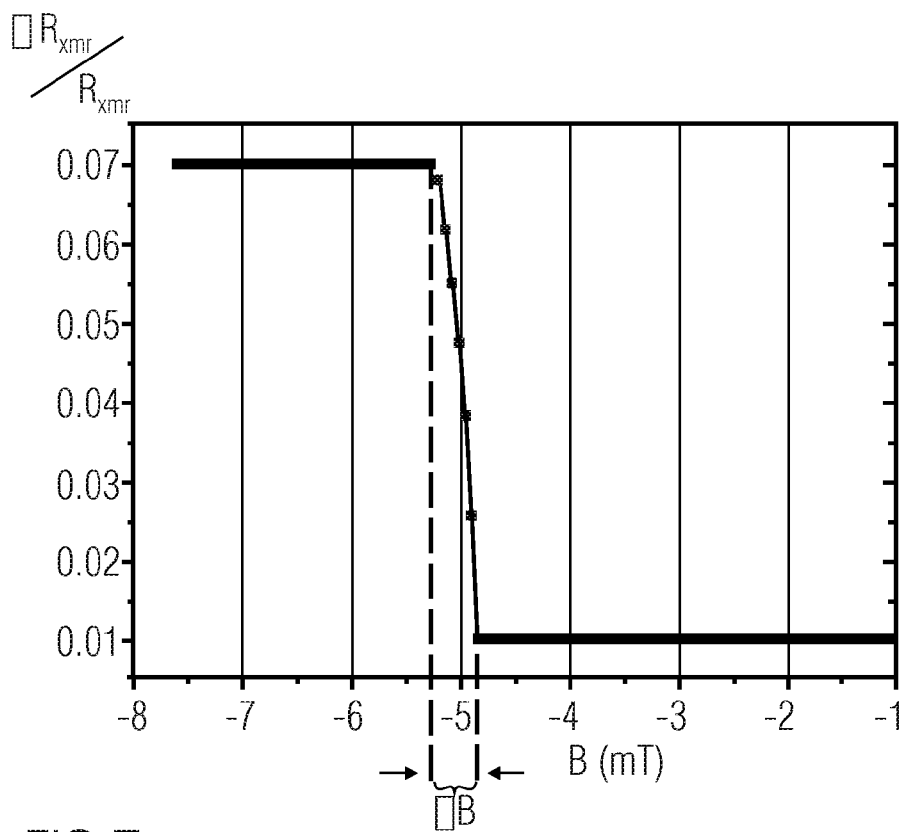
FIG. 7 is a simulated resistance changing characteristic in consideration of a uniaxial magnetic crystal anisotropy of the sensor layer according to an embodiment of the present invention.

FIG. 6 shows a simulated resistance characteristic of an xMR structure according to FIG. 4, when a moderate ferromagnetic coupling between the free layer 202 and the reference layer 206 is accounted for. Compared to the example shown in FIG. 5, a shift by approximately B=–5 mT is achieved, whereby also the slope of the resistance changing behavior of the xMR structure and therefore the sensitivity of the magnetic-field sensor 130 and therefore of an inventive air-mass sensor is rendered slightly lower. This effect may, however, be compensated for, for example, by impressing a magnetic anisotropy axis into the sensor layer 202 along the reference magnetization, for example, by means of a further magnetic tempering step. An effect of a magnetic anisotropy axis in the sensor layer 202 along the reference magnetization is shown in FIG. 7. In order to obtain the curve shown in FIG. 7, the same simulation parameter as for the curve shown in FIG. 6 were used, with the additional consideration of a uniaxial magnetic crystal anisotropy in the sensor layer 202 in parallel to the reference magnetization. This anisotropy may, for example, be imprinted into the material in a magnetic tempering step in the case of certain (above all amorphous) materials such as CoFeB.

A further possibility of shifting the resistive threshold of the xMR structure is applying an external magnetic support field either supporting or dampening the magnetic field to be measured of the current-carrying conductor 110. Disposed via integrated conductors (metal layer stacks), this has the benefit of an adjustment of the changing point and therefore of the sensitivity of the magnetic-field sensor 130 during operation. This will be discussed in greater detail later on.

A characteristic curve as illustrated in FIG. 7 may be utilized for detecting small changes in the field intensity B of a magnetic field of, for example, a current-carrying conductor having a basic field intensity around B=–5 mT. With an adjusted width of the linear resistance changing range of approximately 1.5 mT, a sensitivity SxMR between approximately 7% of resistance change per mT (for example, for a GMR structure having a GMR swing of 10%) and approximately 66% of resistance change per mT (for example, for a TMR structure having a TMR swing of 100%) may be achieved, depending on the amount of the xMR effect. Here, the GMR or TMR swing is defined as a maximum achieved magnetic-field-dependent resistance change related to a minimum resistance, that is ΔxMR=(RxMR,max–RxMR,min)/RxMR,min.

In the following, a sensitivity of an inventive xMR air-mass sensor is evaluated, and its key quantities are determined.

A resistance change ΔheateR of the heating wire 110 is, for example, determined by the temperature coefficient TCR of the material, being approximately 0.0045 K−1 in the case of aluminum, for example. This approximately corresponds to the measuring sensitivity of known air-mass sensor systems, in which only the resistance change ΔRheater of the heating wire or conductor 110 is evaluated, according to:

$$\frac{\Delta R_{Heater}}{R_{Heater}} = TC_R \cdot \Delta T. \quad (1)$$

For example with constant and/or pulsed voltage supply of the heating wire 110, the temperature-dependent resistance change ΔRheater effects a temperature-dependent change of the current flow I(T) and therefore of the generated magnetic field B so that a magnetic field change ΔB may be calculated according to:

$$\Delta B = B0 \cdot TCR \cdot \Delta T, \quad (2)$$

B0 corresponding to a generated basic magnetic field at a defined operating current at a predefined temperature T0 and ΔT corresponding to a temperature change of the heating wire 110 arising, for example, by means of an air flow circulating around the heating wire 110.

Via the magnetoresistive sensor structure or xMR structure 130, the magnetic field variation ΔB is in turn converted to a resistance change ΔRxMR, according to:

$$\frac{\Delta R_{xMR}}{R_{xMR}} = \Delta B \cdot S_{xMR} = B_0 \cdot S_{xMR} \cdot TC_R \cdot \Delta T. \quad (3)$$

A comparison of equation (1) with equation (3) shows that the measuring sensitivity for an inventive air-mass sensor based on xMR structures is determined, next to the temperature coefficient TCR of the conductor material, by the product of the basic magnetic field B0, which is generated by the operating current I0, and the steepness SxMR of the changing curve as well. Adjusting the product of B0·SxMR to B0·SxMR>1 therefore results in a considerably enhanced measuring sensitivity of an air-mass sensor on the basis of the inventive concept as compared to previous measuring methods.

As has already been described above, by using TMR structures, values for SxMR>0.5 mT−1 may, for example, be achieved. Therefrom, a minimum intensity of a basic magnetic field of B0=2 mT may be calculated, wherein the field should be generated by the operating current I0 through the thermistor or the conductor structure 110 so as to be able to achieve improved measuring sensitivity of an air-mass sensor on the basis of the inventive concept as compared to previous measuring methods.

Figure 8A:
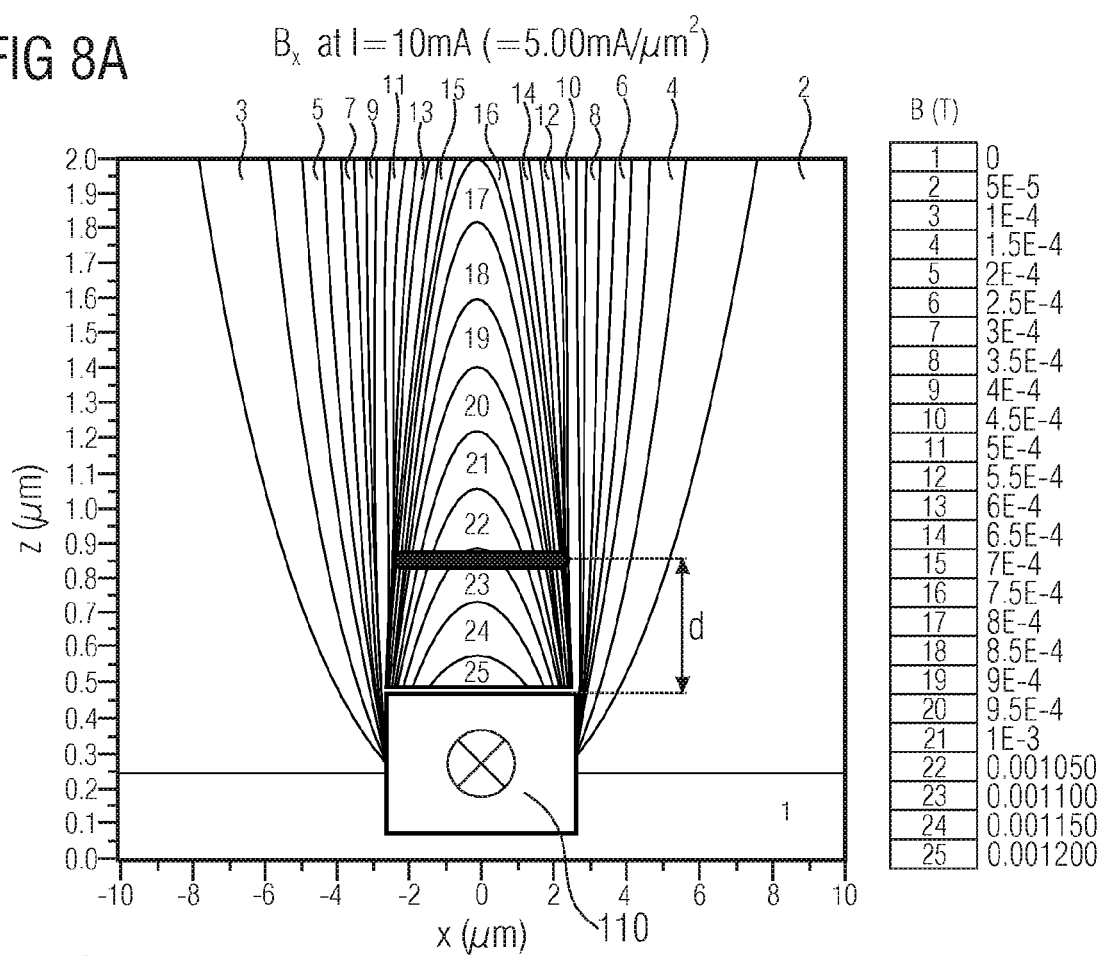
FIG. 8a is a representation of a distribution of a positive, lateral component of a magnetic field of a current-carrying conductor according to an embodiment of the present invention.

For the evaluation of intensities of lateral magnetic fields that may realistically be achieved in air-mass sensors, FIG. 8a shows a distribution of a (lateral) positive x component Bx of a magnetic field as is generated, for example, by means of a conductor strip with a width of 5 μm and a thickness of 400 nm at a current feed of 10 mA (corresponds to a current density of 5 mA/μm2). Typically, the conductor strips are adapted for a thickness of 100 nm to 1000 nm and a width slightly wider than that of the xMR strip.

FIG. 8a shows a conductor 110 carrying a current I0=10 mA flowing into the drawing plane. This results in areas of different magnetic field intensities in distances d from the conductor 110 in the z direction. As the distance d from the conductor 110 increases, the intensity of the x component Bx of the magnetic field typically decreases.

Figure 8B:
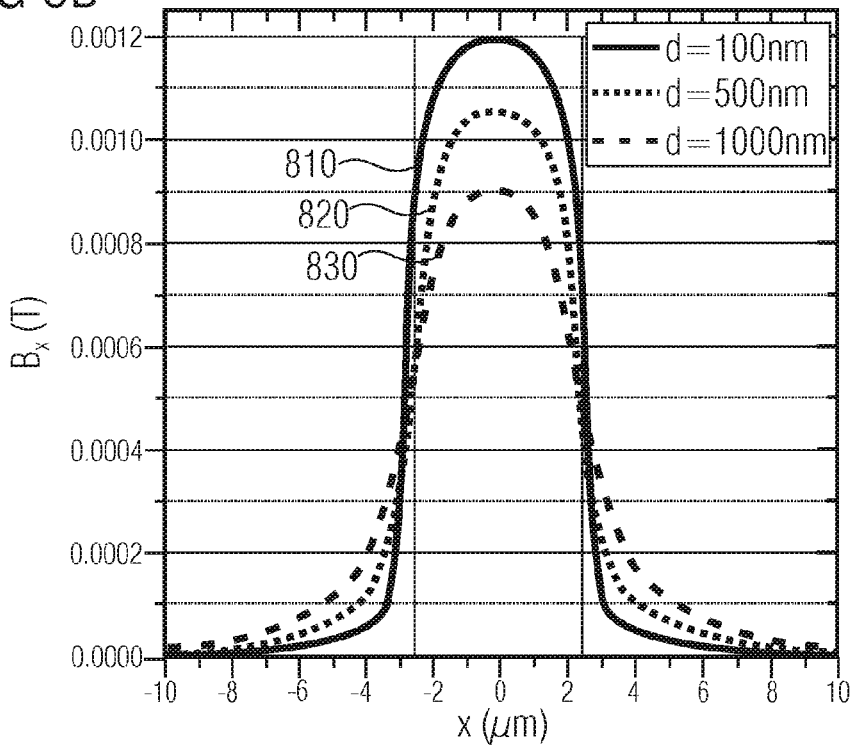
FIG. 8b is a representation of Z sections through the magnetic-field distribution illustrated in FIG. 8a for various distances d from the conductor surface according to an embodiment of the present invention.

FIG. 8b shows the corresponding magnetic field intensities for sections through the z plane for various distances d from the conductor surface of the conductor 110.

FIG. 8b shows a curve 810 for the intensity of the x component Bx resulting in a distance d=100 nm from the conductor surface of the conductor 110. Furthermore, FIG. 8b shows a curve 820 yielded for a distance d=500 nm from the surface of the conductor 110. Finally, the curve in FIG. 8b designated with reference numeral 830 describes the curve of the magnetic field intensity in a distance d=1000 nm from the surface of the conductor 110.

Figure 9A:
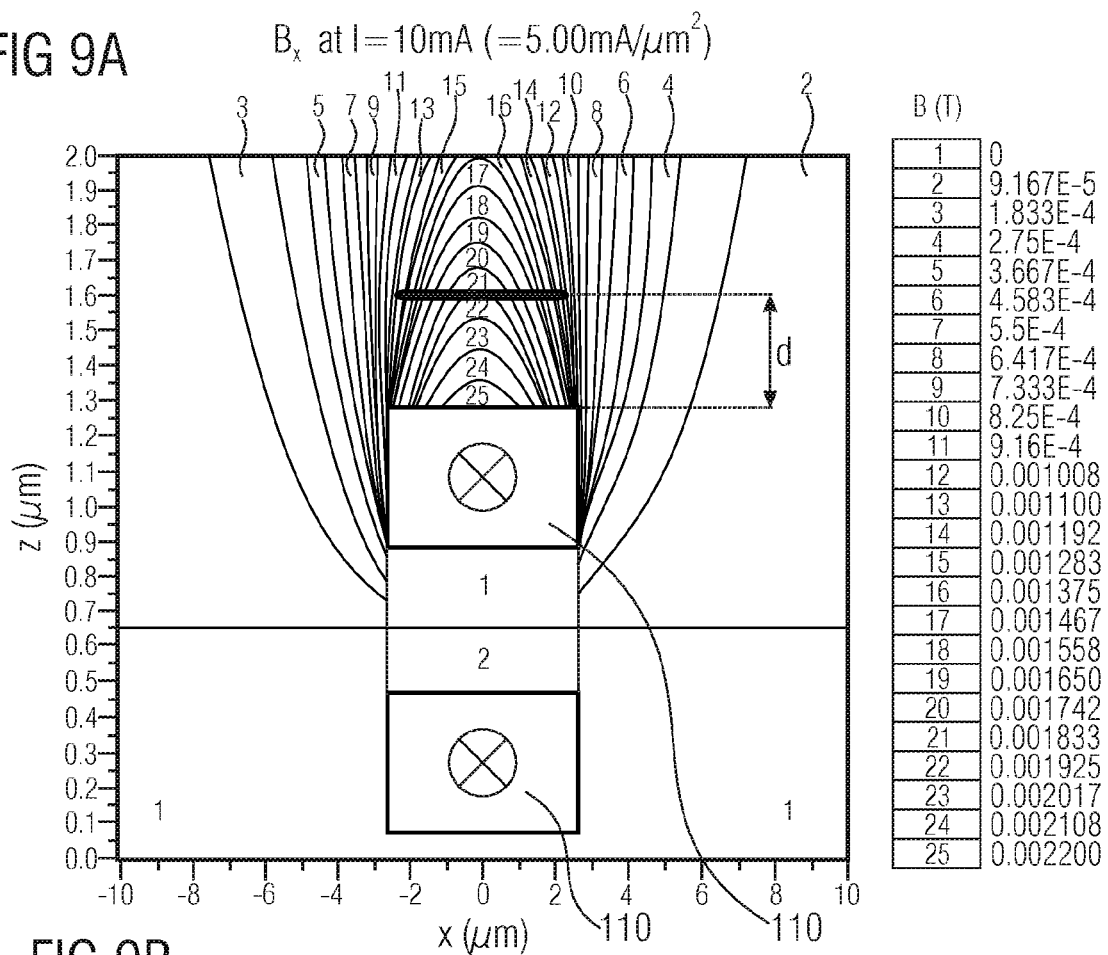
FIG. 9a is a representation of a distribution of a positive, lateral component of a magnetic field of two conductors spaced apart from each other and carrying current in the same direction according to an embodiment of the present invention.
Figure 9B:
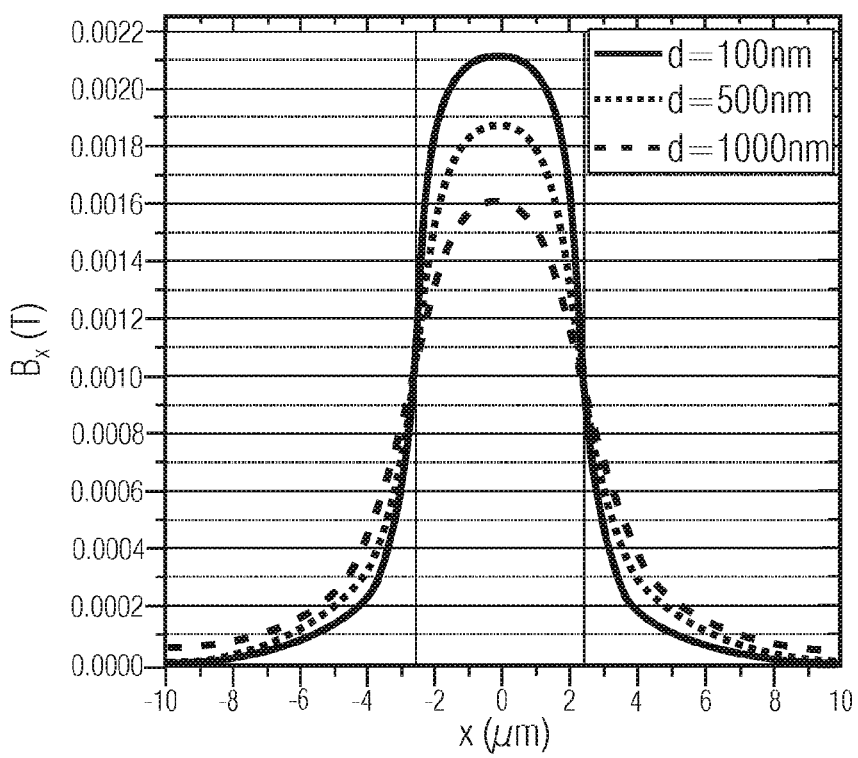
FIG. 9b is a representation of Z sections through the magnetic-field distribution illustrated in FIG. 9a for various distances d from the topmost conductor surface according to an embodiment of the present invention.

Depending on distance d, thus lateral magnetic fields between 0.9 and 1.2 mT per 10 mA of current through the conductor strip 110 may be achieved. The magnetic field intensity may be almost doubled if, for example, a further conductor strip connected in series is provided below the first conductor 110 illustrated in FIG. 8a, wherein the current I0 flows in the same direction through each of the conductor strips, as is shown in FIGS. 9a and 9b.

In the conductor geometries assumed in FIGS. 8a to 9b, therefore a basic current I0 of at least approximately I0=20 mA should be flowing through the thermistor or conductor strip 110 to achieve the measuring sensitivities of previous measuring systems. Higher currents in combination with a further shifting of the xMR characteristic curves shown in FIGS. 6 and 7 may lead to increasing enhancement of the sensitivity of an inventive measuring system.

In the example of a TMR sensor having a sensitivity of SxMR>1.5 mT1 underlying the above consideration, increasing the heating current from I0=10 mA to I0=20 mA would already result in doubling the system sensitivity as compared to simple resistance measurement of the thermistor 110. In order to minimize heating effects accompanying further increased current densities, a measurement (that is conductor strip current feed as well as determination of the xMR resistance) according to an embodiment of the present invention may also be effected, for example, in a pulsed manner, wherein a pulsed supply voltage may be larger in amount than a time-constant supply voltage. Larger voltages result in larger current densities and therefore in increased system sensitivity.

According to an aspect of the present invention, the xMR-based measuring principle also allows generating a differential measuring signal, which may be substantially advantageous with respect to measuring technology and sensitivity, for example, with respect to interference fields. The precondition here is realizing on a chip xMR elements the resistive thresholds thereof are shifted both towards positive and negative magnetic fields. This may be achieved by locally generated support fields Bsupp in opposite directions each to the magnetic field to be detected Bgen by conductor strips running above and/or below the xMR structure. For generating a difference signal, according to an embodiment of the invention, a measuring element is constructed of two xMR sensors that may, for example, be adjacent to each other, wherein the changing current I(T) to be detected passes through a conductor loop above and/or below the two xMR structures in respectively opposite directions. The support field Bsupp is advantageously opposite to the respective magnetic field Bgen to be detected and constantly corresponds to the basic magnetic field B0 (=magnetic field generated by the current I without a change in temperature) at the location of the xMR structure, as far as the amount is concerned, so that the magnetic field to be sensed is compensated for except for the magnetic field changes to be detected. For this purpose, advantageously, the xMR element should have no inherent resistive threshold shift. This connection is exemplarily shown in FIG. 10a.

Figure 10A:
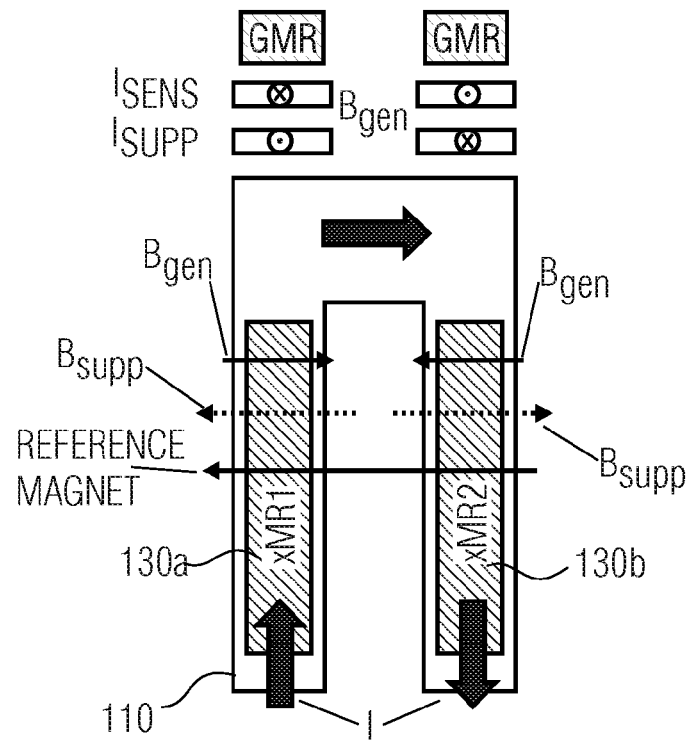
FIG. 10a is a schematic representation of a cross section and a top view of a sensor assembly according to an embodiment of the present invention.

FIG. 10a shows a top view of a meandering conductor structure 110 running below a first magnetoresistive element 130a having an xMR structure and a second magnetoresistive element 130b having an xMR structure. The magnetization direction of the reference layers of the magnetoresistive elements 130a, 130b runs, as is indicated in FIG. 10a, from right to left. A current I flows through the conductor structure 110 in clockwise direction from bottom left to bottom right. In cross-section, it can be seen that the current for generating the magnetic support field is opposite to the respective current to be sensed.

The magnetic field Bgen generated in the left-hand half of the conductor 110 by the current I flowing from bottom to top, which exceeds the oppositely directed magnetic support field as far as the amount is concerned, magnetizes the free layer of the spin-valve structure of the first xMR element 130a in a manner antiparallel to the magnetization direction of the reference layer of the xMR element 130a. This serves to increase the electric resistance RxMR1 of the first xMR structure 130a. By contrast, the magnetic field generated by the current I flowing from top to bottom in the right-hand side of the conductor 110, which exceeds the oppositely directed magnetic support field as far as the amount is concerned, magnetizes the free layer of the spin-valve structure of the second xMR element 130b in parallel to the magnetization direction of the reference layer of the second xMR element 130b. As a result, the electric resistance RxMR2 of the second xMR structure 130b decreases. Correspondingly, the resistance RxMR1 decreases, and the resistance RxMR2 increases when the magnetic field generated by the current I(T) is smaller than the magnetic support field.

Figure 10B:
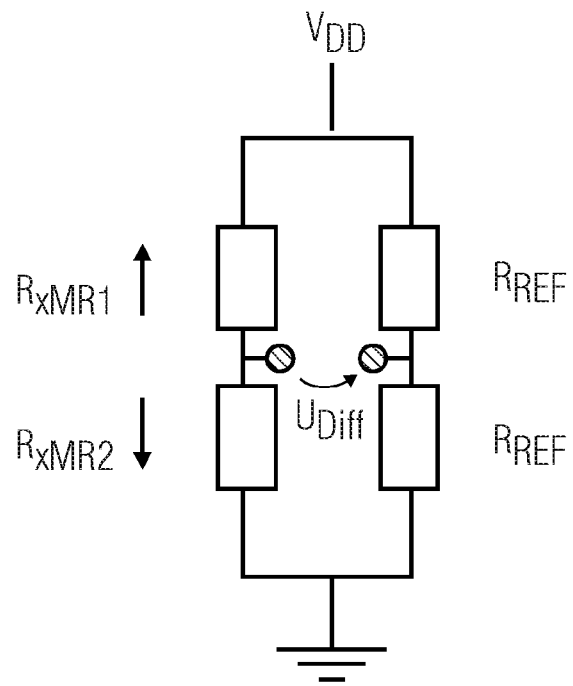
FIG. 10b is a representation of a circuit of the sensor assembly of FIG. 10a according to an embodiment of the present invention.

Using two xMR structures connected according to FIG. 10a, a difference signal may be obtained with the help of two fixed reference resistors RREF (for example, configured on a semiconductor chip in a polysilicon material), as is indicated in FIG. 10b.

The voltage supply for generating the magnetic support field is generally advantageously chosen to be opposite to the voltage supply for the magnetic field generated by the current I(T) to be detected. In the case of a sinusoidal AC voltage, this would, for example, result in a phase offset of a 180° of the voltage for generating the magnetic support field to the voltage for the magnetic field to be detected. Here, the external magnetic support field is adjustable such that it compensates the magnetic field to be detected caused by the current flow through the conductor structure 110 at a defined temperature T0 of the conductor structure 110 at the location of the magnetoresistive element 130 allocated to the conductor structure 110 within a tolerance range. The tolerance range results from the amount of the sum of the external magnetic support field Bsupp and the magnetic field B0 to be detected caused by the current flow through the conductor structure 110 and opposite to Bsupp at the defined temperature T0, that is |B0+Bsupp|. Here, |B0+Bsupp| is advantageously less than 20% of the magnetic field to be detected B0 caused by the current flow through the conductor structure 110, that is, |B0+Bsupp|<0.2 B0, and more advantageously less than 0.05 B0. Ideally, |B0+Bsupp| is at least approximately zero.

FIG. 10b shows a so-called Wheatstone measuring bridge comprising a parallel circuit of two voltage dividers. The left-hand branch of the Wheatstone measuring bridge illustrated in FIG. 10b comprises a series connection of two xMR elements according to the principle represented in FIG. 10a with resistors RxMR1 and RxMR2. The right-hand branch of the Wheatstone measuring bridge comprises a series connection of two equally sized reference resistors RREF. Furthermore, the Wheatstone measuring bridge is connected between a supply voltage VDD and a ground potential and is able to provide an output signal UDiff between the two center taps of the bridge circuit.

The measuring bridge is balanced when the bridge diagonal voltage UDiff=0, that is when the resistance ratio in the two voltage dividers is equal. If a current flows, for example, at a constant or pulsed supply voltage, through a conductor loop arranged according to FIG. 10a, then, as has already been described with respect to FIG. 10a, the resistance RxMR1 of the first xMR structure 130a increases whereas the resistance RxMR2 of the second xMR structure 130b decreases. This results in the resistance ratio RxMR1/RxMR2 to shift, and a voltage UDiff proportional to the current flow through the conductor structure 110 may be measured between the two center taps of the Wheatstone measuring bridge. As has already been described above, the current I through the conductor 110 is in turn proportional to a temperature T of the conductor 110. The temperature-dependent change of the resistance value of the conductor 110 is a measure for a physical characteristic of the liquid or gaseous medium flowing past, the physical characteristic exhibiting a mass, a throughput, a flow velocity, a flow velocity distribution, or a temperature of the liquid or gaseous medium flowing past when the conductor structure 110 is thermally coupled to the fluid. In an air-mass sensor, for example, the temperature T of the conductor 110 is dependent on the air and/or the medium circulating the conductor 110.

Figure 11A:
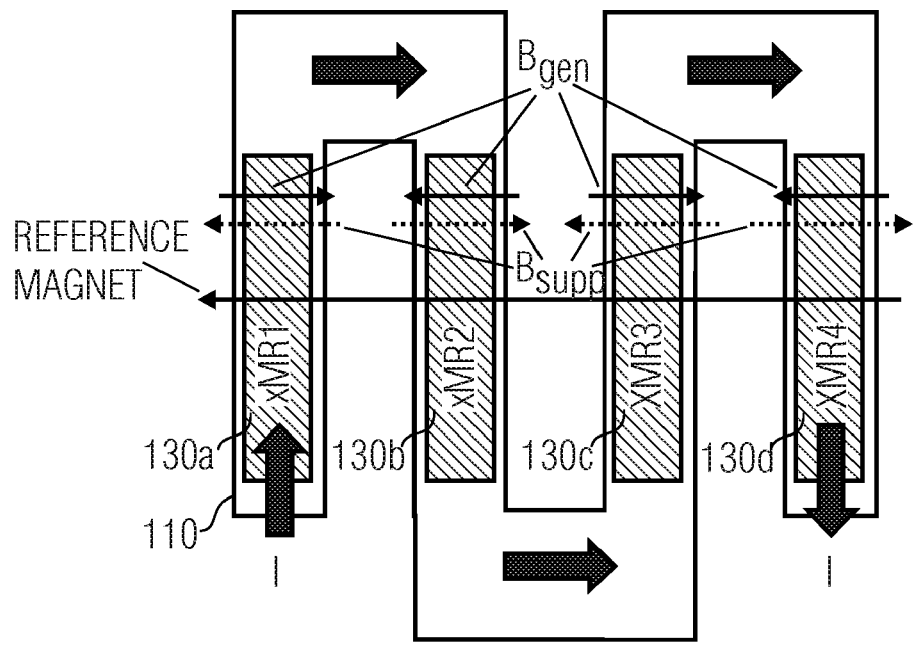
FIG. 11a is a schematic representation of a top view of a sensor assembly according to a further embodiment of the present invention.

The difference voltage UDiff may, for example, be doubled, if four xMR elements are connected in a manner analog to FIG. 11a so that two xMR elements increase their resistances and two decrease their resistances each so that instead of the half bridge illustrated in FIG. 10b a full bridge having a double difference signal may be realized. A schematic top view as well as one possible circuit for realizing a full bridge are illustrated in the FIGS. 11a and 11b.

FIG. 11a shows a top view of a meandering conductor structure 110 running below a first magnetoresistive element 130a, a second magnetoresistive element 130b, a third magnetoresistive element 130c and a fourth magnetoresistive element 130d. The magnetization direction of the reference layers of the magnetoresistive elements 130a-130d run, as indicated in FIG. 11a, from right to left. A current I flows through the conductor structure 110 from bottom left to bottom right relative to the drawing plane and the orientation of FIG. 11a.

The magnetic fields generated by the respective current I flowing from bottom to top, which exceed the oppositely directed magnetic support field as far as the amount is concerned, each magnetize the free layer of the first xMR element 130a and the third xMR element 130c in a manner antiparallel to the magnetization direction of the reference layer of the xMR elements 130a-130d.

As a result, the electric resistances RxMR1 and RxMR2 of the first xMR structure 130a and the third xMR structure 130c are increased. By contrast, the magnetic fields generated by the respective current I flowing from top to bottom, which exceed the oppositely directed magnetic support field as far as the amount is concerned, magnetize the respective free layer of the second xMR element 130b and the fourth xMR element 130d in a manner parallel to the magnetization direction of the reference layer of the xMR elements 130a-130d. As a result, the electric resistances RxMR2 and RxMR4 of the second xMR structure 130b and the fourth xMR structure 130d, respectively, decrease. If the magnetic field generated by the current I(T) is smaller than the constant magnetic support field B0, the behavior of the resistances will be correspondingly inverted.

Figure 11B:
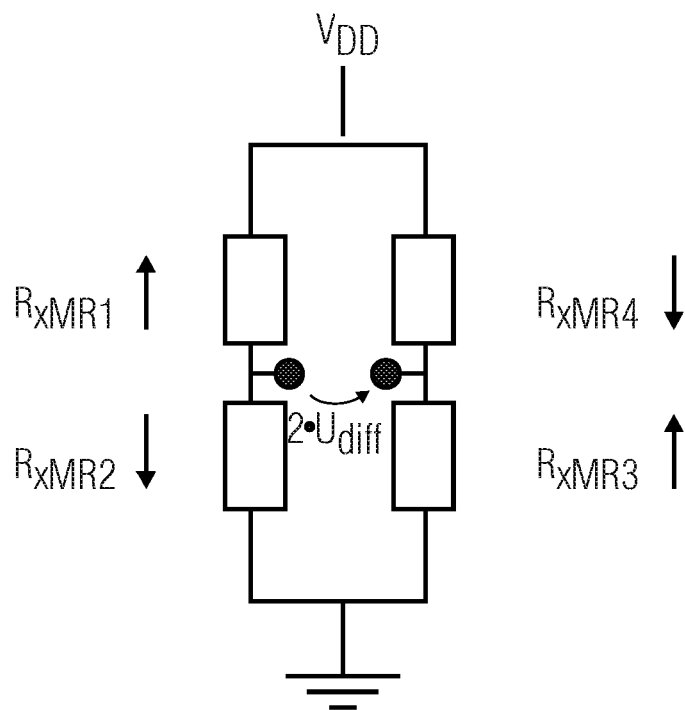
FIG. 11b is a representation of a circuit of the sensor assembly of FIG. 11a for generating a full-bridge reference signal according to an embodiment of the present invention.

With the four xMR structures connected according to FIG. 11a, a difference signal double that of the half bridge of FIG. 10b may be obtained, as is indicated in FIG. 11b.

The Wheatstone measuring bridge illustrated in FIG. 11b comprises a parallel connection of two voltage dividers according to the principle represented in FIG. 11a with resistors RxMR1, RxMR2, RxMR3, and RxMR4. The left-hand branch of the Wheatstone measuring bridge comprises a series connection of the resistors RxMR1 and RxMR2, whereas the right-hand branch of the Wheatstone measuring bridge comprises a series connection of the resistors RxMR3 and RxMR4. Furthermore, the Wheatstone measuring bridge is connected between a supply potential VDD and a ground potential and may provide an output signal UDiff between the two center taps of the bridge circuit.

Therefore, the inventive concept for determining a temperature-dependent resistance value of a conductor structure is advantageous in that a differential output signal UDiff proportional to the temperature-dependent resistance value Rheater(T) of the conductor structure 110 may be generated.

In the following and with respect to FIGS. 12a and 12b, an embodiment of an inventive air-mass sensor 1200 according to the present invention is discussed.

The magnetoresistive air-mass sensor 1200 comprises a semiconductor substrate 1210, for example, of a silicon and/or polysilicon material. Above the semiconductor substrate 1210, the sensor module 1200 has an insulation layer 1220 (ZOX=Zwischenoxid=intermediate oxide). A metal-insulator assembly 1230 consisting of three metal plies 1230a, 1230b, 1230c and insulation layers 1230d, 1230e, 1230f surrounding these metal plies 1230a, 1230b, 1230c is arranged on the insulation layer 1220 advantageously comprising an oxide material. Furthermore, a magnetoresistive sensor structure 1240 is deposited on the metal-insulator assembly 1230. The thickness of the magnetoresistive sensor structures 1240 may be in a range from approximately 2 to 200 nm and advantageously in a range around approximately 50 nm.

In the context of the present description, all xMR structures, that is particularly AMR structures (AMR=anisotropic magneto resistance), GMR structures (GMR=giant magneto resistance), CMR structures (CMR=colossal magneto resistance), EMR structures (EMR=extraordinary magneto resistance), and TMR structures (TMR=tunnel magneto resistance), as well as magnetoresistance structures and spin-valve structures are meant to be magnetoresistive structures and/or sensor structures. It is to be noted here, that the above list is not intended to be comprehensive, wherein with respect to an embodiment of the present invention, practically all magnetoresistive structures and elements may be employed.

Figure 12A:
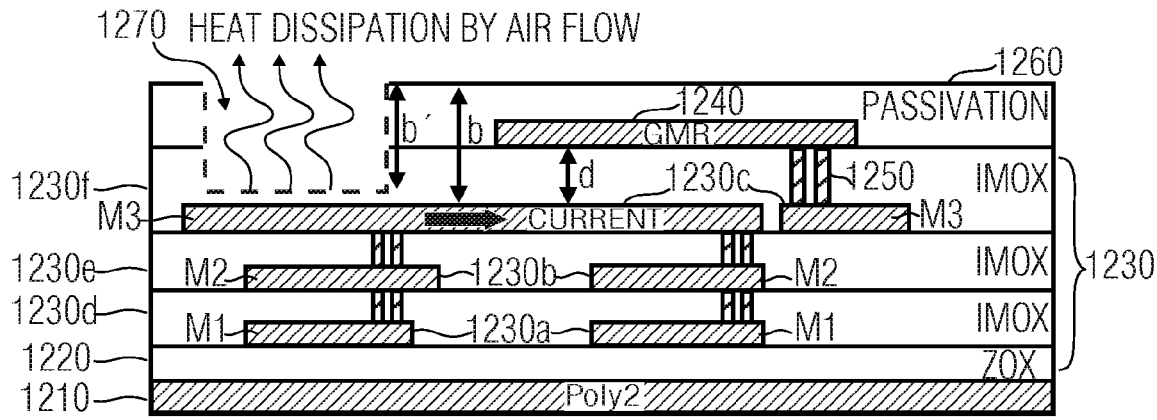
FIG. 12a is a schematic representation of an integrated xMR air-mass sensor in a 3-ply metallization technology according to a further embodiment of the present invention.

As illustrated in FIG. 12a, according to an embodiment of the present invention, the magnetoresistive sensor structure is connected to the metal ply 1230c (M3) via vias 1250. In the same manner, the metal plies 1230a (M1) and 1230b (M2) as well as the metal plies 1230b (M2) and 1230c (M3) are each connected to each other via vias 1250.

As is further shown with respect to the magnetoresistive sensor module 1200 illustrated in FIG. 12a, a covering, closing passivation layer 1260 having an opening 1270 is disposed on the metal-insulator assembly 1230 and the magnetoresistive sensor structure 1240 located thereabove. A thickness of the insulation layer 1230f above the metal ply 1230c (M3) together with the passivation layer 1260 be designated with b. A depth of the opening 1270 be designated with b'. The depth of the opening 1270 is chosen depending on the thermal coupling desired. For maximum thermal coupling, b'=b will be true. Value ranges for b are generally determined by the desired thermal coupling and typically range from 500 nm to 5000 nm.

In the embodiment of the present invention, the metal ply 1230c (M3) is a thermistor and a magnetic-field generator at the same time. The xMR element 1240 is arranged above the topmost metal layer 1230c (M3), separated via the insulation layer 1230f, and for electric wiring connected to the underlying metal 1230c (M3) via vias 1250 common in IC processing and filled with tungsten or similar metals (for example, copper) so that advantageously electrical connection of the magnetoresistive structure 1240 to, for example, terminal areas of an active circuitry not shown may be established. The thickness of the insulator layer 1230f above the metal ply 1230c (M3), and therefore the distance d of the sensor and/or xMR structure 1240 from the conductor 1230c generating the magnetic field (FIG. 12a, left-hand side) may, for example, be adjusted in large areas via CMP processes (CMP=chemical mechanical polishing). For better thermal coupling to a gaseous medium, which may enter through the opening 1270, the insulation layer 1230f is thinned, for example, by means of an etching process above the conductor 1230c in the heating area (FIG. 12a, left-hand side). A remaining remnant thickness of the dielectric 1230f has the benefit that the heating area remains passivated and therefore for example also corrosive gases may be measured using the inventive air-mass sensor illustrated in FIG. 12a. For this purpose, the passivation layer 1260 has a defined thickness in the area of the conductor structure 1230c in a range of 10 nm to 100 µm, advantageously in a range of 0.1 µm to 10 µm, and specifically advantageous in a range of 0.5 µm to 5 µm. The area, in which heat can be dissipated to the environment is spatially separated from that of the xMR element 1240. This is advantageous in that the xMR element 1240 is only little influenced by the development of heat of the thermistor 1230c (FIG. 12a left-hand side).

The metal layers 1230a-1230c and/or the metal-insulator assembly 1230 may be produced by means of standard CMOS processes, depending on the respective application. The metal layer 1230a (M1) may, for example, serve as part of an on-chip evaluation circuit or may be connected to an external evaluation circuit.

Figure 12B:
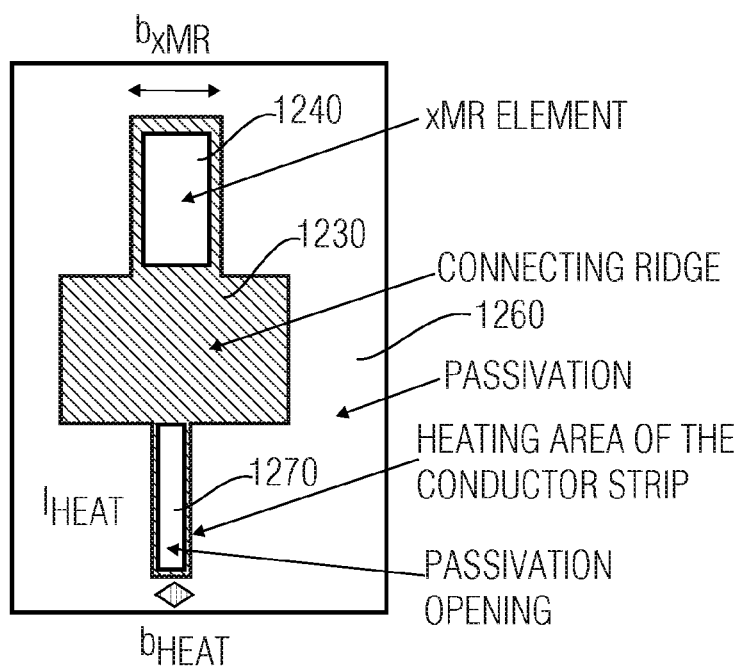
FIG. 12b is a schematic top view of the integrated xMR air-mass sensor of FIG. 12a according to an embodiment of the present invention.

A further benefit is made clear with respect to a schematic top view in FIG. 12b of the air-mass sensor illustrated in FIG. 12a.

FIG. 12b shows the metal layer and/or the conductor 1230 (M3), which is located above the opening 1270 and below the xMR element 1240 relative to the drawing plane of FIG. 12b. The conductor 1230 (M3) has a heating area with a width bheat below the opening 1270, a connecting ridge and a sensor area with a width bxMR below the xMR sensor 1240.

The heating performance and the basic magnetic field B0 generated by the heating current I0 at the location of the xMR element 1240 may be tuned optimally and separate from each other by a choice of the conductor geometries of the conductor 1230 (M3). The heating area may then advantageously be connected to the sensor area via a comparatively wide connecting ridge so that a substantial contribution to the conductor resistance will come from the heating area.

In the following and referring to FIG. 13, a further embodiment of an air-mass sensor 1300 according to the present invention is discussed. So as to simplify the following description, in FIG. 13, like functional elements have the same reference numerals as in FIG. 12a and/or 12b, wherein a repeated description of these features is omitted. Furthermore, all above demonstrations with respect to the functional elements illustrated in FIGS. 12a and/or 12b are likewise applicable to the respective functional elements in FIG. 13.

Figure 13:
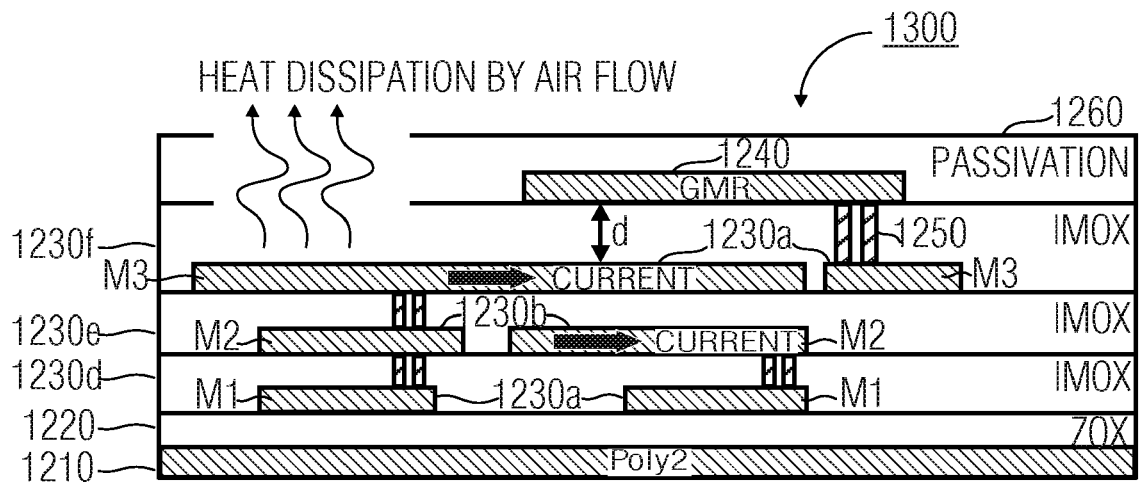
FIG. 13 is a schematic representation of an alternative integrated xMR air-mass sensor in a 3-ply metallization technology according to an embodiment of the present invention.

In the embodiment of the present invention represented in FIG. 13, the conductor 1230c (M3) generating the magnetic field is extended to a conductor running in parallel in the next lower metallization level 1230b (M2) via a suitable circuit, wherein the current in the metallization level 1230b (M2) runs such that the magnetic field prevailing at the location of the xMR element 1240 is increased, as has been described above with respect to FIGS. 9a and 9b.

Figure 14:
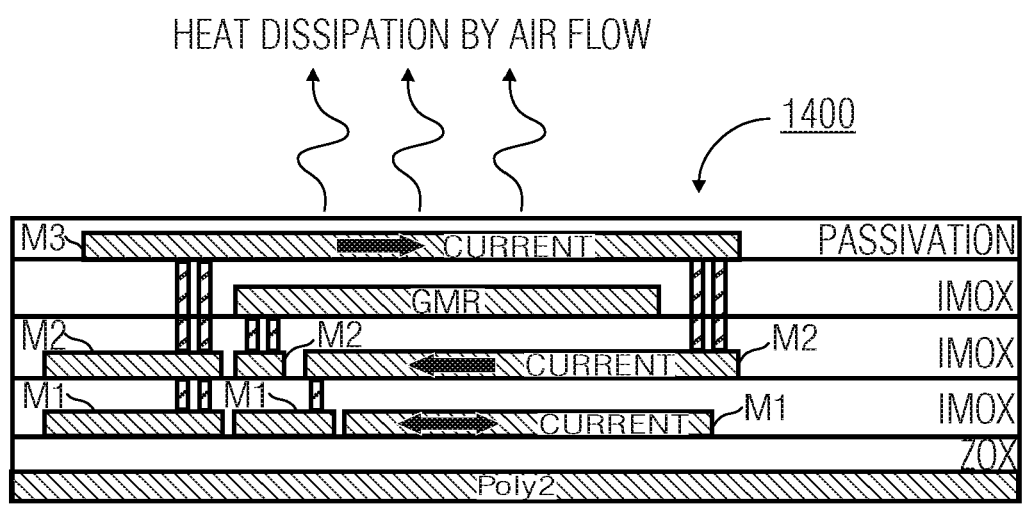
FIG. 14 is a schematic representation of a further alternative integrated xMR air-mass sensor in a 3-ply metallization technology according to an embodiment of the present invention.

FIG. 14 shows a further embodiment of an inventive air-mass sensor 1400 having an xMR sensor element 1240. In order to simplify the following description, in FIG. 14, like functional elements carry the same reference numerals as in FIGS. 12a, b and/or FIG. 13, a repeated description of these features is being omitted.

In the embodiment of the present invention shown in FIG. 14, the xMR element 1240 is located between two metal levels 1230b, 1230c, the topmost metal level 1230c (M3) again serving as a conductor generating a heating field and a magnetic field at the same time. Via the suitable circuit, the current to be sensed is passed from the metal ply 1230c (M3) to the metal ply 1230b (M2) below the GMR element 1240 such that the magnetic field generated by means of the two conductors 1230b, 1230c increases at the location of the xMR element 1240. In the case of identical distances of the metal plies M2, M3 to the xMR element 1240 as well as in the case of identical current densities within both metal plies, the magnetic field doubles at the location of the xMR element 1240.

This embodiment of the present invention is advantageous in that a higher integration density of the air-mass sensor 1400 may be achieved as the heating area and the area generating the magnetic field are identical. A further advantage is the fact that the surface facing the air flow and/or the circulating medium may be designed such, via CMP processes, that it has almost no topology so that a forming of unfavorable turbulences of a current flowing past may be avoided. Furthermore, the thickness of the passivating insulator 1260 remaining on the thermistor 1230c (M3) may be configured thin via the CMP process so as to ensure good thermal coupling to the air flow.

Furthermore, the embodiments of the present invention shown in FIGS. 12a to 14 are provided with a further conductive trace M1 below the xMR structure, in which an adjustable current may also generate a lateral magnetic field the direction of which may be opposite or equal to that of the thermistor. This serves to tune the operating point of the xMR sensor element 1240, as has been described above, so as to intercept scatterings in the xMR layer separation caused by production and achieve maximum yields. In addition, this serves to generate a local magnetic support field necessary for generating the differential sensor signal. It is to be noted that in this case the functions (generating the magnetic support field, carrying the current I(T) to be sensed) of the conductive traces M1 and M2 may be exchanged.

In a further embodiment of the present invention, the heating area may be configured on a thin silicon or silicon nitride membrane. This is advantageous in that the heat dissipation in the direction of the substrate 1210 may be minimized and therefore the ratio of the current change ΔI to the basic heating current I0 may be increased.

Monolithic integration may easily facilitate realizing sensor arrays according to an embodiment of the present invention. An arrangement and a circuit according to further embodiments of the present invention serve to obtain further information beyond a medium air mass by the use of an inventive integrated xMR air-mass sensor. For this purpose, FIG. 15 shows an assembly of eight xMR single sensors 1501-1508 forming two Wheatstone full bridges connected in parallel.

Figure 15:
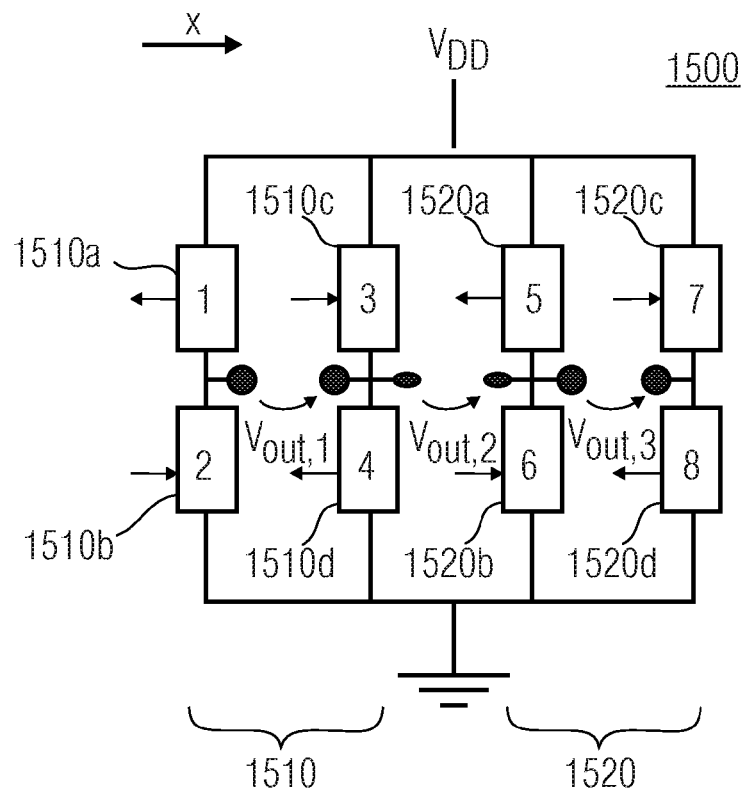
FIG. 15 is a representation of a circuit of eight air-mass sensors forming two Wheatstone full bridges according to an embodiment of the present invention.

In FIG. 15, a schematic circuit diagram of a possible circuit in the form of a double bridge circuit 1500 having eight magnetoresistive magnetic-field sensor elements is illustrated. The double bridge assembly 1500 comprises a first bridge circuitry 1510 and a second bridge circuitry 1520, each consisting of four magnetoresistive single elements 1510a-1510d and 1520a-1520d, the reference magnetization on which being indicated relative to the x axis represented in FIG. 15. The individual magnetoresistive devices 1510a-1510d and 1520a-1520d are connected, as indicated in FIG. 15, wherein the first and second bridge circuits 1510 and 1520 are connected in parallel and further connected between a supply voltage VDD and a ground potential.

During operation of the magnetoresistive sensor assembly 1500 of FIG. 15, the first bridge circuit 1510 provides an output signal Vout1 between the two center taps of the first bridge circuit, whereas the second bridge circuit 1520 provides an output signal Vout3 between the two center taps of the second magnetoresistive bridge circuit, according to the principle described with respect to FIGS. 11a, 11b. Furthermore, a third output voltage Vout2 between the right-hand center tap of the first bridge circuit 1510 and the left-hand center tap of the second bridge circuit 1520 may be provided.

Figure 16:
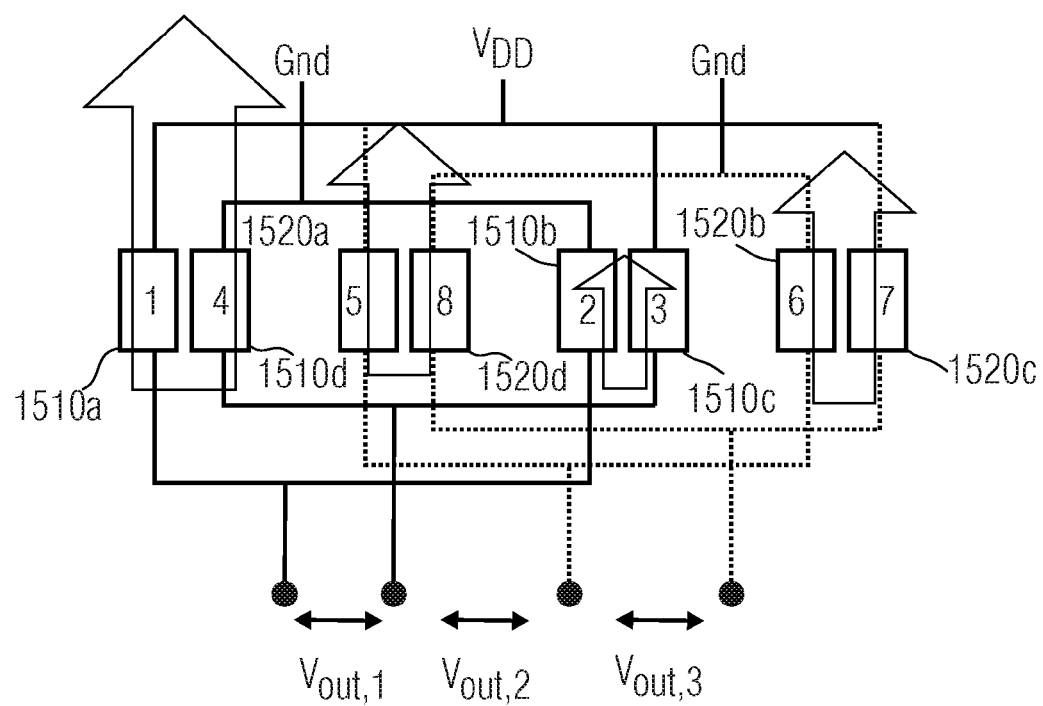
FIG. 16 is a representation of an interleaved sensor assembly for the local detection of flow velocities according to an embodiment of the present invention.

An interleave of the magnetoresistive single elements illustrated in FIG. 15 according to the assembly illustrated in FIG. 16, for example, facilitates measuring a flow velocity distribution between the sensors 1510a and 1520d at the discrete points of the sensors 1510a/1510d, 1520a/1520d, 1510b/1510c and 1520b/1520c via the respective center tap and evaluating the bridge voltages Vout1, Vout2 and Vout3 at the points sketched in FIG. 16. Here, above and/or below the sensors 1510a/1510d, 1520a/1520d, 1510b/1510c, and 1520b/1520c, there are running conductor structures and/or thermistors, each carrying a current proportional to the respective flow velocity, as has already been described with respect to FIG. 11a.

Different flow velocities are designated by arrows of differing sizes in FIG. 16. Depending on the respective flow velocity, a different resistance change of the xMR elements is yielded, which results in different voltages at the tap points, as has been described above.

Basically, large cross-sections of up to several millimeters may be detected by such parallel connection of several full bridges, as it is shown in FIGS. 15 and 16. The only limitation, as far as the geometry is concerned, is a chip size of the integrated circuit. As in the case of several parallel bridge branches the necessary heating current I0 also increases in a linear manner, the individual bridge branches may, for example, be pulsed by means of a multiplexer and read serially, according to an embodiment of the present invention. This makes it possible to supply multiple bridge branches by means of a minimal operating current.

To sum the inventive concept up, it provides a measuring system for detecting a resistance change occurring in a conductor strip heated by a defined supply voltage due to cooling effects, for example, in an air flow. Here, what is measured through an evaluation of the magnetic field generated by the heating current is a current change. According to the invention, the intensity of the magnetic field is in turn converted to a resistance value through a magnetoresistive sensor element. Here, the sensitivity of the magnetoresistive element determines a "conversion ratio" of the resistance change of the heated conductor strip to the resistance change of the magnetoresistive sensor element. Here, the xMR technology facilitates generating a differential output voltage that is proportional to the temperature change of the heated conductor strip by means of a respective connection of several single elements.

The inventive concept provides a resistance change sensor for measuring resistance changes characterized in that the resistance to be sensed is provided with a constant voltage and the resistance change results in a current change flowing through the resistor to be sensed, that the current flowing through the resistor to be sensed is carried in conductor strips above and/or below a magnetoresistive sensor element, that the magnetic-field change induced in the conductor strip by the current change is converted to a resistance change at the location of the magnetoresistive sensor element, that several magnetoresistive sensor elements and conductor strips are arranged in pairs such that a current change in the conductor strip effects a resistance increase and decrease in pairs of the sensor elements, and that these magnetoresistive sensor elements are connected up to form Wheatstone half or full bridges.

The inventive concept facilitates an air-mass sensor for measuring the mass of a flowing gaseous medium characterized in that the sensor consists of a thermistor facing the flowing medium and a magnetic-field sensor, that the thermistor is supplied with a constant voltage, and that the current flowing through the thermistor is detected by at least one magnetic-field sensor, that the magnetic-field sensor is a magnetoresistive sensor, particularly based on AMR, GMR or TMR technology, and that the thermistor and the magnetic-field sensor are deposited on a common substrate. According to an embodiment of the present invention, the thermistor and the magnetic-field sensor are arranged spatially apart (horizontally integrated). According to a further embodiment of the present invention, the thermistor and the magnetic-field sensor are arranged spatially on top of each other (vertically integrated). Furthermore, the sensor element may be monolithically integrated with a circuit on a common substrate. The resistance changing point may be shifted towards larger magnetic measuring fields via the stack design. Apart from that, the resistance changing point may be shifted towards larger magnetic measuring fields via a magnetic support field, and the support field may be generated via conductor strips deposited on the substrate. The support field may also be deposited externally.

According to embodiments of the present invention, the measuring sensitivity may be adjusted during operation via the operating voltage. In at least two magnetic-field sensors, the current flowing through the thermistor according to embodiments of the present invention runs above and/or below and in opposite directions each, wherein in addition, a constant magnetic support field in a direction opposite to the magnetic field to be sensed is generated each, that all but compensates the magnetic field to be sensed at the location of the xMR element without any temperature change. A change of the magnetic field to be sensed due to, for example, a temperature change therefore results in an increase and decrease of the resistance in one respective magnetic-field sensor. Here, the magnetic-field sensors may be connected up to form a Wheatstone half bridge. According to further embodiments of the present invention, in at least four magnetic-field sensors, the current flowing through the thermistor runs above and/or below in opposite directions each, wherein in addition, a constant magnetic support field in a direction opposite to the magnetic field to be sensed is generated each, that all but compensates the magnetic field to be sensed at the location of the xMR element without any temperature change. A change of the magnetic field to be sensed therefore results in an increase and decrease of the resistance in two respective magnetic-field sensors. Here, the magnetic-field sensors are connected to form a Wheatstone full bridge. In addition, at least two half bridge branches may be connected to form a Wheatstone full bridge. According to an embodiment of the present invention, an inventive sensor assembly is characterized in that the single sensors connected to the high (low) potential of the one half bridge form a resistor pair each with the single sensors connected to the low (high) potential of the other half bridge, the respective resistor pairs being located in close proximity.

Furthermore, embodiments of the present invention provide a method for determining a flow distribution so that in a sensor assembly described above, a bridge difference voltage may be ascribed to flow velocity differences at the location of the two resistor pairs. The resistors may be supplied with voltage in a pulsed manner and be read out, or the individual bridge branches may be supplied with voltage in a serial manner via a multiplexer and be read out.

The inventive concept for determining a temperature-dependent resistance change of a conductor structure therefore provides a number of advantages.

The inventive xMR-based measuring principle enables generating a differential measuring signal, which is clearly advantageous with respect to a measuring technology insensitivity as far as, for example, interference fields are concerned. In contrast to conventional systems, an inventive xMR-based measuring system may have a higher measuring sensitivity, for example, by the use of the Wheatstone full-bridge circuit described above, or, for example, by increasing the heating current. In addition, the measuring sensitivity of an inventive measuring system is adjustable, for example, by a special layer design of the ferromagnetic and/or non-magnetic layers. Even during operation, an external magnetic support field may be applied, for example, via integrated conductors, so as to either support or weaken the magnetic field to be measured, which enables adjusting the resistance changing point and therefore the sensitivity during operation.

A further benefit of the inventive concept is full compatibility with the CMOS and bipolar technologies currently used in the semiconductor industry, that may ensure cost-effective mass production. As described above, monolithic integration enables easy realization of sensor arrays so as to obtain, for example, further information on the distribution and direction of an air flow velocity. A magnetoresistive sensor structure may be installed in any basic semiconductor manufacturing process, for example, in a CMOS or bipolar technology, with marginal adjustments only. Here, a magnetoresistive sensor structure is deposited on a planar surface to be conditioned independently of the basic semiconductor manufacturing process. Thus, an ideally planar contact area between the magnetoresistive sensor structure and contact pads may enable extremely robust and reliable contacting of the magnetoresistive sensor structure, that is of the xMR layer systems. Furthermore, embodiments of the present invention may be monolithically integrated in technologies (for example, surface micromechanics), in which thermistors may be deposited on membranes, wherein the measuring sensitivity of the inventive sensor may be improved by better thermal decoupling from the substrate.

In addition, it is to be noted that the inventive scheme may also be implemented in software, depending on the conditions. The implementation may be effected on a digital storage medium, in particular a floppy disc or a CD with electronically readable control signals that are able to cooperate with a programmable computer system and/or microcontroller such that the respective method is effected. In general, embodiments of the invention therefore also consist in a computer program product with a program code for performing the inventive method stored on a machine-readable carrier, when the computer program product runs on a computer and/or microcontroller. In other words, embodiments of the invention may therefore also be realized as a computer program with a program code for performing the method when the computer program runs on a computer and/or microcontroller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An apparatus for detecting a change of a physical quantity by means of a conductor structure, the apparatus comprising:
a voltage supply for applying a defined supply signal to the conductor structure so as to effect a current flow through the conductor structure, the current flow being changeable by the physical quantity; and
a detector for detecting a magnetic field caused by the current flow through the conductor structure, by means of a magnetoresistive element allocated to the conductor structure, the change of the physical quantity being associated with a change of the detected magnetic field.

2. The apparatus of claim 1, wherein the change of the physical quantity is a temperature-dependent resistance change of the conductor structure.

3. The apparatus of claim 1, wherein the defined supply signal is an arbitrary reconstructable voltage, the arbitrary reconstructable voltage being a periodic AC voltage, a constant voltage or a time-pulsed DC voltage.

4. The apparatus of claim 1, wherein the magnetoresistive element comprises a GMR structure (GMR=giant magneto resistance), a TMR structure (TMR=tunnel magneto resistance) or a magnetoresistance structure.

5. The apparatus of claim 1, further comprising:
a provider of an external magnetic support field influencing the magnetic field caused by means of the current flow through the conductor structure such that a resistive threshold of the magnetoresistive element is adjustable with respect to a change of a physical quantity between two different values of the physical quantity via the external magnetic support field.

6. The apparatus of claim 5, wherein the external magnetic support field is adjustable such that it compensates the magnetic field caused by the current flow through the conductor structure at a defined temperature of the conductor structure at the location of the magnetoresistive element allocated to the conductor structure within a tolerance range.

7. An apparatus for detecting a temperature-dependent resistance change of a conductor structure adapted to be thermally coupled to a liquid or gaseous medium flowing past, the apparatus comprising:
a voltage supply for applying a defined supply voltage to the conductor structure so as to effect, in dependence on a temperature-dependent resistance of the conductor structure, a current flow through the conductor structure; and
a detector for detecting a magnetic field caused by the current flow through the conductor structure by means of a magnetoresistive element allocated to the conductor structure, a change of the temperature-dependent resistance of the conductor structure being associated with a change of the detected magnetic field.

8. The apparatus of claim 7, wherein the defined supply voltage is an arbitrary reconstructable voltage.

9. The apparatus of claim 7, wherein a change of the detected magnetic field is a measure for a physical characteristic of the liquid or gaseous medium flowing past, the physical characteristic exhibiting a mass, a throughput, a flow velocity, a flow velocity distribution or a temperature of the liquid or gaseous medium flowing past when the conductor structure is thermally coupled to the fluid.

10. The apparatus of claim 7, wherein the magnetoresistive element comprises a GMR structure (GMR=giant magneto resistance), a TMR structure (TMR=tunnel magneto resistance) or a magnetoresistance structure.

11. The apparatus of claim 7, wherein the magnetoresistive element comprises a resistive threshold depending on the detected magnetic field and exhibiting a steepness relative to a resistance change between two different electric resistance values.

12. The apparatus of claim 7, wherein the magnetoresistive element comprises a spin-valve structure comprising a sensor layer, an intermediate layer and a reference layer with a reference magnetization, the sensor layer and the reference layer comprising a defined magnetic coupling or being magnetically decoupled.

13. The apparatus of claim 12, wherein the resistive threshold and/or the steepness thereof is adjustable by the defined magnetic coupling between the sensor layer and the reference layer.

14. The apparatus of claim 11, wherein the resistive threshold and/or the steepness thereof is adjustable by an impressed magnetic anisotropy axis in the sensor layer.

15. The apparatus of claim 14, wherein the magnetic anisotropy axis is adjusted by a lateral geometric aspect ratio of the magnetoresistive element.

16. The apparatus of claim 7, further comprising:
a provider of an external magnetic support field influencing the magnetic field caused by means of the current flow through the conductor structure such that a resistive threshold of the magnetoresistive element is adjustable relative to a resistance change between two different electric resistance values via the external magnetic support field.

17. The apparatus of claim 16, wherein the external magnetic support field is adjustable such that it compensates the magnetic field caused by the current flow through the conductor structure at a defined temperature of the conductor structure at the location of the magnetoresistive element allocated to the conductor structure within a tolerance range.

18. The apparatus of claim 7, wherein the magnetoresistive element comprises a plurality of magnetoresistive single elements connected such so as to provide a differential output signal relative to the change of the temperature-dependent resistance value of the conductor structure.

19. The apparatus of claim 18, wherein the magnetoresistive single elements form bridge elements of a Wheatstone half-bridge or full-bridge circuit.

20. A sensor for detecting the mass of a flowing, liquid or gaseous medium, the sensor comprising:
a conductor structure, comprising a temperature-dependent resistance value and adapted to be thermally coupled to the gaseous medium such that the temperature-dependent resistance value is a measure for a physical characteristic of the flowing, liquid or gaseous medium;

a voltage supply for applying a defined supply voltage to the conductor structure so as to effect, in dependence on the temperature-dependent resistance value of the conductor structure, a current flow therethrough; and a magnetoresistive element allocated to the conductor structure such so as to detect a magnetic field caused by the current-carrying conductor structure, a change of the temperature-dependent resistance value of the conductor structure being associated with a change of the detected magnetic field.

21. The sensor of claim 20, wherein the physical characteristic is a mass, a throughput, a flow velocity, a flow velocity distribution or a temperature of the flowing, liquid or gaseous medium when the conductor structure is thermally coupled to the fluid.

22. The sensor of claim 20, wherein the defined supply voltage is a constant voltage or a time-pulsed DC voltage.

23. The sensor of claim 20, wherein the magnetoresistive element comprises a resistive threshold depending on the detected magnetic field and exhibiting a steepness relative to a resistance characteristic of the magnetoresistive element between two different electric resistance values.

24. The sensor of claim 22, wherein the magnetoresistive element is formed as an GMR structure (GMR=giant magneto resistance) or TMR structure (TMR=tunnel magneto resistance) with a spin-valve assembly, which comprises a sensor layer, an intermediate layer and a reference layer with a reference magnetization, the sensor layer and the reference layer comprising a defined magnetic coupling or being magnetically decoupled.

25. The sensor of claim 24, wherein the resistive threshold and/or the steepness thereof is adjustable by the defined magnetic coupling between the sensor layer and the reference layer.

26. The sensor of claim 23, wherein the resistive threshold is adjustable by an impressed magnetic anisotropy axis in the sensor layer.

27. The sensor of claim 26, wherein the magnetic anisotropy axis is adjusted by a lateral geometric aspect ratio of the magnetoresistive element.

28. The sensor of claim 20, further comprising:

a provider of an external magnetic support field influencing the magnetic field caused by means of the current flow through the conductor structure such that the resistive threshold of the magnetoresistive element is adjustable via the external magnetic support field.

29. The sensor of claim 28, wherein the external magnetic support field is adjustable such that it compensates the magnetic field caused by the current flow through the conductor structure at a defined temperature of the conductor structure at the location of the magnetoresistive element allocated to the conductor structure within a tolerance range.

30. The sensor of claim 20, wherein the magnetoresistive element comprises a plurality of magnetoresistive single elements connected to form at least one bridge element of a Wheatstone half-bridge or full-bridge circuit so as to provide a differential evaluation signal relative to the change of the temperature-dependent resistance value of the conductor structure.

31. The sensor of claim 20, wherein the conductor structure and the magnetoresistive element are arranged together on a main surface of a semiconductor substrate, the magnetoresistive sensor element and the conductor structure being arranged vertically or horizontally relative to the main surface of the semiconductor substrate in an integrated manner.

32. The sensor of claim 20, wherein a metal-insulator assembly is arranged on the main surface of the semiconductor substrate and comprises the conductor structure and an insulation material at least partially surrounding the conductor structure, a magnetoresistive sensor structure being arranged on a planar surface of the insulation material of the metal-insulator assembly, wherein on the magnetoresistive sensor structure and on the metal-insulator assembly a passivation layer is arranged adapted so as to achieve a defined thermal coupling of the conductor structure with the gaseous or liquid medium flowing past.

33. The sensor of claim 32, wherein the passivation layer comprises a defined thickness ranging from 0.1 µm to 10 µm.

34. The sensor of claim 20, further comprising a further conductor structure arranged, relative to the main surface of the semiconductor substrate, above or below the magnetoresistive sensor structure.

35. The sensor of claim 34, wherein the additional conductor structure is formed as a thermistor and/or a conductor generating a magnetic support field.

36. The sensor of claim 20, wherein the sensor comprises a plurality of metal plies comprising conductor structures and comprising surrounding insulation structures or insulation layers.

37. The sensor of claim 20, further comprising a further magnetoresistive sensor element, wherein both magnetoresistive sensor elements are allocated to the conductor structure such that a change of the magnetic field generated by means of the current flowing through the conductor structure effects an opposing resistance change in the magnetoresistive sensor element and the further magnetoresistive sensor element, the two magnetoresistive sensor elements being connected to form a Wheatstone half bridge so that a differential output signal relative to the resistance change is tappable at the two magnetoresistive sensor elements.

38. The sensor of claim 37 comprising a further plurality of magnetoresistive sensor elements, two of which each being connected to form further Wheatstone half bridges and being connected between a first and second reference potential, wherein a magnetoresistive element of one of the two half-bridge branches connected to the first reference potential forms a resistor pair each with a magnetoresistive element of the respective other one of the two half bridge-branches connected to the second reference potential, wherein magnetoresistive elements forming a pair each are located in proximity to each other with respect to a flow velocity determination area so that the differential output signal indicates flow velocity differences at the respective locations of the two resistor pairs relative to the flow velocity determination area in the form of a bridge difference voltage between the two half-bridge branches.

39. The sensor of claim 20, wherein the sensor further comprises a multiplexer so as to supply individual half-bridge branches with the defined supply voltage serially via the multiplexer.

40. A method for detecting a change of a physical quantity by means of a conductor structure, the method comprising:

applying a defined supply voltage to the conductor structure so as to effect a current flow through the conductor structure, the current flow being changeable by the physical quantity; and detecting a magnetic field caused by the current flow through the conductor structure by means of a magnetoresistive element allocated to the conductor structure, a change of the physical quantity being associated with a change of the detected magnetic field.

41. The method of claim 40, wherein the change of the physical quantity comprises a temperature-dependent resistance change.

42. The method of claim 40, wherein the defined supply signal is an arbitrary reconstructable voltage, the arbitrary reconstructable voltage being a periodic AC voltage, a constant voltage or a time-pulsed DC voltage.

43. A method for detecting a temperature-dependent resistance change of a conductor structure adapted to be thermally coupled to a liquid or gaseous medium flowing past, the method comprising:
applying a defined supply voltage to the conductor structure so as to effect, in dependence on a temperature-dependent resistance of the conductor structure, a current flow through the conductor structure; and
detecting a magnetic field caused by the current flow through the conductor structure by means of a magnetoresistive element allocated to the conductor structure, a change of the temperature-dependent resistance of the conductor structure being associated with a change of the detected magnetic field.

44. The method of claim 43, wherein the defined voltage is an arbitrary reconstructable voltage comprising a periodic AC voltage, a constant voltage or a time-pulsed DC voltage.

45. The method of claim 43, further comprising:
allocating the change of the temperature-dependent resistance value of the conductor structure to a physical characteristic of the liquid or gaseous medium flowing past, the physical characteristic exhibiting a mass, a throughput, a flow velocity, a flow velocity distribution or a temperature of the liquid or gaseous medium flowing past when the conductor structure is thermally coupled to the medium.

46. The method of claim 43, further comprising an adjustment of a resistance changing range of the magnetoresistive element via an impressed magnetic anisotropy axis.

47. The method of claim 46, wherein the magnetic anisotropy axis is adjusted by a lateral geometric aspect ratio of the magnetoresistive element.

48. The method of claim 43, wherein the magnetoresistive element comprises a resistive threshold dependent on the detected magnetic field relative to a resistance characteristic between two different electric resistance values, the method further comprising:
adjusting the resistive threshold of the magnetoresistive element via an external magnetic support field influencing the magnetic field caused by means of the current flow through the conductor structure.

49. A computer-readable storage medium having a computer program stored thereon, the computer program for performing, when the computer program runs on a computer and/or microcontroller, a method for detecting a change of a physical quantity by means of a conductor structure, comprising:
applying a defined supply voltage to the conductor structure so as to effect a current flow through the conductor structure, the current flow being changeable by the physical quantity; and
detecting a magnetic field caused by the current flow through the conductor structure by means of a magnetoresistive element allocated to the conductor structure, a change of the physical quantity being associated with a change of the detected magnetic field.

50. A computer-readable storage medium having a computer program stored thereon, the computer program for performing, when the computer program runs on a computer and/or microcontroller, a method for detecting a temperature-dependent resistance change of a conductor structure adapted to be thermally coupled to a liquid or gaseous medium flowing past, comprising:
applying a defined supply voltage to the conductor structure so as to effect, in dependence on a temperature-dependent resistance of the conductor structure, a current flow through the conductor structure; and
detecting a magnetic field caused by the current flow through the conductor structure by means of a magnetoresistive element allocated to the conductor structure, a change of the temperature-dependent resistance of the conductor structure being associated with a change of the detected magnetic field.

51. An apparatus for determining a change of a physical quantity, comprising:
a voltage supply for applying a defined supply signal to a conductor structure so as to effect a current flow through the conductor structure, the current flow being changeable by the physical quantity;
a detector for detecting a magnetic field caused by the current flow through the conductor structure, by means of a magnetoresistive element allocated to the conductor structure, a change of the physical quantity being associated with a change of the detected magnetic field; and
a determiner for determining the change of the physical quantity based on the change of the detected magnetic field.

52. An apparatus for determining a physical quantity, comprising:
a voltage supply for applying a defined supply signal to a conductor structure so as to effect a current flow through the conductor structure, the current flow being changeable by the physical quantity;
a detector for detecting a magnetic field caused by the current flow through the conductor structure, by means of a magnetoresistive element allocated to the conductor structure, the physical quantity being associated with the detected magnetic field; and
a determiner for determining the physical quantity based on the detected magnetic field.

* * * * *